United States Patent [19]
Hashizume

[11] Patent Number: 5,448,575
[45] Date of Patent: Sep. 5, 1995

[54] BYPASS SCAN PATH AND INTEGRATED CIRCUIT DEVICE USING THE SAME

[75] Inventor: Takeshi Hashizume, Hyogo, Japan

[73] Assignee: Mitsubishi Denki Kabushiki Kaisha, Tokyo, Japan

[21] Appl. No.: 901,294

[22] Filed: Jun. 19, 1992

[30] Foreign Application Priority Data

Sep. 17, 1991 [JP] Japan .................................. 3-236211

[51] Int. Cl.$^6$ .............................................. G01R 31/28
[52] U.S. Cl. ...................................... 371/22.3; 371/22.1
[58] Field of Search .................... 371/22.3, 22.1, 22.6, 371/22.5; 324/763

[56] References Cited

U.S. PATENT DOCUMENTS

| | | | |
|---|---|---|---|
| 4,860,290 | 8/1989 | Daniels et al. | 371/25 |
| 4,872,169 | 10/1989 | Whetzel, Jr. | 371/22.3 |
| 5,109,190 | 4/1992 | Sakashita et al. | 371/22.3 X |
| 5,130,647 | 7/1992 | Sakashita et al. | 371/22.3 X |
| 5,150,044 | 9/1992 | Hashizume et al. | 571/22.3 X |
| 5,260,949 | 11/1993 | Hashizume et al. | 371/22.3 |

OTHER PUBLICATIONS

Van Riessen et al. publication, IEEE Design & Test of Computers, Feb. 1990, pp. 9–19, "Designing and Implementing an Architecture with Boundary Scan".

Beenker publication, IEEE Design & Test of Computers, Apr. 1990, pp. 41–51, "Implementing Macro Test in Silicon Compiler Design".

Hashizume et al. publication in IEICE Technical Report, "An Enhancement of Cell-Based Test Design Method for Boundary Scan Architecture", Nov. 1990, pp. 63–69.

Primary Examiner—Emanuel T. Voeltz
Assistant Examiner—M. Kemper
Attorney, Agent, or Firm—Lowe, Price, LeBlanc & Becker

[57] ABSTRACT

A bypass scan path is formed of a scan path and a scan path selecting circuit. The scan path has its operation controlled with a control signal group including a strobe signal, an update signal, shift clock signals. The scan path selecting circuit has its operation controlled with a reset signal and the control signal group for the scan path, and requires no other control signals. The reset signal and the control signal group for the scan path can be generated by a test controller defined in the standard of the boundary scan test of the IEEE 1149.1.

31 Claims, 16 Drawing Sheets

BYPASS SCAN PATH AND INTEGRATED CIRCUIT DEVICE USING THE SAME

BACKGROUND OF THE INVENTION

1. Field of the Invention

The present invention relates to a bypass scan path for serially transmitting various data and an integrated circuit device using the same.

2. Description of the Background Art

In integrated circuit devices, especially in ones having complex functional logics inside, it is extremely difficult to test internal conditions using only primary input/output terminals. Such difficulty is expressed by two terms "observability" and "controllability".

The controllability indicates difficulty in controlling signals inside a circuit. The observability indicates difficulty in observing internal conditions in a circuit.

For example, in order to know if a failure exists at a certain point inside a circuit, it is necessary to be able to freely control an input signal applied thereto. Also, an output obtained by predetermined input must be precisely observed. Accordingly, if one of the observability and controllability is lacking, it is impossible to make a determination as to whether there exists a failure inside the circuit. However, in an integrated circuit device having complex functional logics, a large number of gates are interposed between a tested portion and a primary input terminal. Accordingly, it is extremely difficult to obtain excellent observability and controllability. Furthermore, with development in the semiconductor technique, integrated circuit devices are increasingly becoming larger scale and more complex to make testing inside circuits extremely difficult.

Accordingly, the significance of so-called designing for facilitating testing has been on the increase. Application of testing includes a plurality of steps, i.e., the steps of producing test data, execution of operation of a circuit to be tested with the test data, output of test result, and confirmation thereof. With development of larger scale circuits, a time required for testing increases and it is becoming more and more significant to complete testing in a short time.

Accordingly, to facilitate testing, a method referred to as scan designing described below is often used. In the scan designing, shift register latches (hereinafter referred to as SRL) are first provided at an observation point (a position at which output is to be observed) and a control point (a position at which input is to be set) inside an integrated circuit. A plurality of SRLs are connected in series to form a shift path (scan path) where data can be transmitted.

Test data is externally applied to a scan path and transmitted serially in the scan path and desired test data is set in a SRL at a control point. Stored data at each SRL is applied to a circuit to be tested. An output of the circuit to be tested (test result data) is outputted to a SRL at each observation point and stored therein. The stored data of the SRL is again serially transmitted on the scan path and outputted as a serial signal outside from an output terminal. Provision of such a scan path enables observability and controllability in a deep portion of an integrated circuit device.

However, the scan designing handles data with time. Accordingly, when a bit length of a scan path increases because of an improvement in large scale integrated circuit devices, a transmission time of data becomes longer accordingly and a testing time also increases. In testing of integrated circuits, reduction of test time and the number of test pins are serious problems to be achieved.

Conventionally, accordingly, a single scan path is divided into a plurality of portions and a bypass path is provided for directly connecting an input and an output bypassing the scan path in each portion to selectively transmitting inputted data to either of SRLs and a bypass path. Thus, since required portion only performs operation of shifting data in a scan path, data transmission time is reduced to reduce test time.

A conventional example of a scan path having bypass means (hereinafter referred to as a bypass scan path) will be described below.

FIG. 13 is a block diagram illustrating configuration of a conventional bypass scan path disclosed in IEICE Technical Report, CAS90-97, VLD9-75, ICD90-146 "An Enhancement of Cell-Based Test Design Method for Boundary Scan Architecture" by Hashizume et al., for example. In the figure, the bypass scan path includes a scan path 10 and a scan path selecting circuit 20. Scan path 10 includes a plurality of SRLs 11–16 connected in series. Scan path selecting circuit 20 includes 2-input and 1-output multiplexer 21, selection data holding latch 22 and an AND gate 23. A serial signal inputted into scan path selecting circuit 20 from a serial input terminal (hereinafter referred to as a SI terminal) 201 is applied to one input terminal of multiplexer 21 and also applied to a SRL 11 at the first stage of scan path 10 through a serial output terminal (hereinafter referred to as a SO terminal) 202. An output of a SRL 16 at the final stage of scan path 10 is applied to the other input terminal of multiplexer 21 and a data input terminal D of selection data holding latch 22 through an SI terminal 203. A mode latch signal is applied from input terminal 205 to a clock signal input terminal C of selection data holding latch 22. A signal outputted from an output terminal Q of selection data holding latch 22 is applied to a control terminal of multiplexer 21 as a select control signal of multiplexer 21 and also applied to one input terminal of AND gate 23 after its logic is inverted. A group of control signals for controlling operation of scan path 10 are applied from an input terminal 207 to the other input terminal of AND gate 23. The group of control signals include a strobe signal STB, an update signal UD, shift clock signals SCLK1 and SCLK2. AND gate 23 is individually provided for each of strobe signal STB, update signal UD, shift clock signals SCLK1 and SCLK2, which input-controls the group of control signals. An output of AND gate 23 is applied to each SRL through an output terminal 208.

Data input terminals DI1–DI6, data output terminals DO1–DO6 are connected to each of SRLs 11–16, respectively. Data input terminals DI1–DI6 are connected to input terminals, i.e. observation points of a circuit to be tested inside an integrated circuit device. Data output terminals DO1–DO6 are connected to output terminals, i.e., control points of a circuit to be tested inside the integrated circuit device. In a test mode, each of SRLs 11–16 applies held test data to each control point through each of data output terminals DO1–DO6. Each of SRLs 11–16 also captures test result data obtained from each observation point from each of data input terminals DI1–DI6. On the other hand, in a normal mode, each of SRLs 11–16 attains a transmissive state (a data through state), where system data is transmitted between data input terminals DI1–DI6 and data output terminals DO1–DO6.

FIG. 14 is a block diagram illustrating one example of a configuration of a SRL shown in FIG. 13. In the figure, the SRL includes 2-input data latch 31, and data latches 32 and 33. Test result data or system data is applied to a first data input terminal D1 of 2-input data latch 31 through a data input terminal DI (any one of input terminals DI1–DI6 in FIG. 13). Serial signals (select data, test data, test result data) are applied to a second data input terminal D2 of 2-input data latch 31 through a SI terminal 34. A strobe signal STB is applied to a first clock signal input terminal C1 of 2-input data latch 31 through an input terminal 35. A shift clock signal SCLK1 is applied to a second clock input terminal C2 of 2-input data latch 31 through an input terminal 36. 2-input data latch 31 captures and holds data from data input terminal D1 when a strobe signal STB is at a H level, and captures and holds serial data from SI terminal 34 when a shift clock signal SCLK1 is at a H level. A signal outputted from an output terminal Q of 2-input data latch 31 is applied to each input terminal D of data latches 32 and 33. An update signal UD is applied to a clock signal input terminal C of data latch 32 through input terminal 37. A shift clock signal SCLK 2 is applied through input terminal 38 to a clock signal input terminal C of data latch 33. Data latch 32 captures and holds an output signal of 2-input data latch 31 when an update signal UD is at a H level. Data latch 33 captures and holds an output signal of 2-input data latch 31 when shift clock signal SCLK2 is at a H level. A signal outputted from an output terminal Q of data latch 32 is applied to a data output terminal DO (any one of data output terminals DO1–DO6 in FIG. 13). A signal outputted from an output terminal Q of data latch 33 is applied to an SO terminal 39. SI terminal 34 is connected to SO terminal 39 of a SRL at a previous stage or SO terminal 202 in FIG. 13. SO terminal 39 is connected to SI terminal 34 of a SRL at a following stage or SI terminal 203 in FIG. 13. Input terminals 35–38 are connected to output terminal 208 in FIG. 13.

The SRL shown in FIG. 14 shifts a serial signal inputted from SI terminal 34 to SO terminal 39 in response to non-overlapping 2-phase shift clock signals SCLK1, SCLK2. Data inputted from data input terminal DI is captured in 2-input data latch 31 in response to a strobe signal STB. Held data of 2-input data latch 31 is captured in data latch 32 in response to an update signal UD and outputted from data output terminal DO.

For the reference, an example of a circuit configuration of the SRL shown in FIG. 14 is illustrated in FIG. 15. As shown in the figure, 2-input data latch 31 is formed of inverters IV1–IV4 and N channel MOS transistors TR1 and TR2, data latch 32 is formed of inverters IV5–IV7 and an N channel MOS transistor TR3 and data latch 33 is formed of inverters IV8–IV10 and an N channel MOS transistor TR4. Inverters IV3 and IV4, inverters IV5 and IV6, and inverters IV8 and IV9 form ratio type latch circuits, respectively.

FIG. 16 is a circuit diagram illustrating one example of a structure of the selection data holding latch shown in FIG. 13. In the figure, selection data holding latch 22 includes inverters IV11–IV13 and N channel MOS transistors TR5 and TR6. Inverters IV11 and IV12 are connected in antiparallel to form a ratio type latch circuit. A transistor TR5 is interposed between an input terminal of inverter IV11 and data input terminal D. A gate of transistor TR5 is connected to clock signal input terminal C. An input terminal of inverter IV11 is grounded through transistor TR6. A gate of transistor TR6 is connected to a reset terminal R. Inverter IV13 is interposed between an output terminal of inverter IV11 and an output terminal Q.

FIG. 17 is block diagram illustrating configuration of a test module in which a test aids circuit by a scan path shown in FIG. 13 is incorporated. In the figure, each of SRLs 11–16 is connected to an input terminal or an output terminal which is a control point or an observation point of a functional module (hereinafter referred to as BUT) of an objective of testing to form scan path 10. In the example of FIG. 17, SRLs 11–13 are connected to input terminals of BUT 40 and SRLs 14–16 are connected to output terminals of BUT 40. BUT 40 includes a predetermined logic circuit inside. Scan path 10 is connected to scan path selecting circuit 20. A test aids circuit is formed of scan path 10 and scan path select circuit 20, and the test aids circuit and BUT 40 form a test module 50. A serial signal is inputted from a SI terminal 501 of test module 50 and a serial signal is outputted from a SO terminal 504. SI terminal 501, SO terminal 504 are respectively connected to a SI terminal 201 and a SO terminal 204 of scan path selecting circuit 20. A mode latch signal, a reset signal and a group of control signals are respectively inputted into input terminals 205, 206, 207 of scan path selecting circuit 20 from input terminals 505, 506, 507.

FIG. 18 is a block diagram illustrating one example of a structure of an integrated circuit device in which the test module shown in FIG. 17 is incorporated. In the figure, inside integrated circuit device 60, three test modules 50a–50c are provided, for example. Structure of each test module 50a–50c is similar to that of test module 50 in FIG. 17. Each of test modules 50a–50c is serially connected between a SI terminal 601 and a SO terminal 602 related to select data and test data. That is, SI terminal 601 is connected to a SI terminal 501 of test module 50a, a SO terminal 504 of test module 50a is connected to a SI terminal 501 of test 50b, a SO terminal 504 of test module 50b is connected to a SI terminal 501 of test module 50c and a SO terminal 504 of test module 50c is connected to a SO terminal 602. Thus, a single scan data transmitting path is formed between SI terminal 601 and SO terminal 602. The group of control signals inputted from input terminal 603 are applied to each input terminal 507 of each test module 50a–50c. A reset signal inputted from input terminal 604 is applied to each input terminal 506 of each of test modules 50a–50c. A mode latch signal inputted from input terminal 605 is applied to each input terminal 505 of each of test modules 50a–50c. System data inputted from input terminals 606–608 are applied to test module 50a and processed. The system data processed by test module 50a is applied to test module 50b and processed. Also, a part of system data processed by test module 50a is applied to test module 50c and processed. System data inputted from input terminals 609, 610 are applied to test module 50c and processed. The system data processed by test module 50b is outputted from output terminals 611–613 to outside. The system data processed by test module 50c is outputted from output terminals 614–616 to outside.

Next, operation of the integrated circuit device shown in FIG. 18 will be described according to the following items.

(1) Operation in a normal mode
(2) Operation in a test mode

<1> Reset
<2> Transmission of selection data
  a) Shift-in of selection data
  b) Capturing of selection data
<3> Transmission of test data
  a) Shift-in of test data
  b) Provision of test data
  c) Capturing of test result data
  d) Shift-out of test result data Here, the normal mode refers to a mode in which inputted system data is processed and outputted.

Reset in a test mode is made in order to select a scan path (shift path) in each test module 50a–50c as preparation for transmitting selection data. The selection data is data for making a determination as to whether a scan path is to be selected or a bypass path is selected as a transmission path of data in each test module.

(1) Operation in Normal Mode

A reset signal is raised to an active level, that is, a H level, and selection data holding latch 22 in scan path selecting circuit 20 is reset. Thus, an output signal of output terminal Q in a selection data holding latch 22 is brought to a L level and one input terminal of AND gate 23 is fixed to a H level. As a result, AND gate 23 transmits a group of control signals to each of SRLs 11–16. At this time, a strobe signal STB and an update signal UD are fixed at H level and shift clock signals SCLK1 and SCLK2 are fixed to a L level. As a result, in the SRL shown in FIG. 14, 2-input data latch 31, data latch 32 merely operate as a non-inversion drivers. Accordingly a transmissive state (data through state) is implemented between data input terminal DI and data output terminal DO. From input terminals 606–601, system data is inputted. The inputted system data is processed by BUT 40 in each test module 50a–50c and then externally outputted from output terminals 611–616. At this time, in a SRL in each scan path, a transmissive state is implemented between data input terminal DI and data output terminal DO, so that transmission of system data is not prevented.

(2) Operation in Test Mode
<1> Reset

A reset signal is raised to an active level, for example a H level. Thus, selection data holding latch 22 in scan path selecting circuit 20 is reset. As a result, an output signal of output terminal Q in selection data holding latch 22 is fixed to a L level. Multiplexer 21, which is supplied with a selection control signal of a L level from selection data holding latch 22, selects an output signal of scan path 10, that is, an input signal from SI terminal 203 and outputs it to SO terminal 204. On the other hand, since one input terminal of AND gate 23 is fixed to a H level, AND gate 23 transmits a group of control signals to each of SRLs 11–16. Accordingly, scan path 10 comes in a data transmittable state. Operation described above is similarly performed in each of test modules 50a–50c. Accordingly, in each of test modules 50a–50c, a shift path, i.e. scan path 10 is selected as a data transmission path.

<2> Transmission of Selection Data
(a) Shift-In of Selection Data

Selection data is serially inputted from SI terminal 601. At this time, shift clock signals SCLK1 and SCLK2 are provided as non-overlapping two-phase clock signals. Accordingly, each SRL in scan path 10 shifts selection data inputted from SI terminal 34 by alternate latch operations of 2-input data latch 31 and data latch 33. Here, selection data is inputted together with dummy data. Selection data is finally set in a SRL at the final stage in a scan path in each of test modules 50a–50c. Dummy data is set in other SRLs. For example in a scan path 10 having structure as shown in FIG. 13, selection data is set in SRL 16 and dummy data are set in other SRLs 11–15. Selection data for selecting a scan path is determined to "0". Selection data for selecting a bypass path is determined to "1". Accordingly, when selecting a scan path, data of "XXXXX0" is set in each of SRLs 11–16. When selecting a bypass path, data of "XXXXX1" is set in each of SRLs 11–16. Here, "X" is dummy data. When the selection data reaches the SRL 16 at the final stage in scan path 10 in each of test modules 50a–50c, input of selection data and shift operation of SRL are stopped.

b) Capturing of Selection Data

A mode latch signal is raised to an active level, i.e., a H level. Thus, selection data holding latch 22 inside scan path selecting circuit 20 captures and latches data held by SRL 16, that is, selection data. When selection data holding latch 22 latches selection data "0", an output signal of selection data holding latch 22 attains a "L" level, so that multiplexer 21 selects an output signal of scan path 10. Also, AND gate 23 transmits a group of control signals to each of SRLs 11–16, so that scan path 10 comes in a data transmittable state. When selection data holding latch 22 latches selection data "1", an output signal of selection data holding latch 22 attains a H level, so that multiplexer 21 selects an input signal from SI terminal 201. Also, since one input terminal of AND gate 23 is fixed to a H level, it does not transmit a group of control signals to each of SRLs 11–16. Accordingly, scan path 10 comes in a data untransmittable state.

<3> Transmission of Test Data
a) Shift-In of Test Data

Test data is serially inputted from SI terminal 601. At this time, shift clock signals SCLK1 and SCLK2 are provided as non-overlapping two-phase clocks signals. Accordingly, in a test module in which a scan path is selected by MUX 21, each of SRLs 11–16 sequentially shifts test data inputted from SI terminal 34 to SO terminal 39. On the other hand, in a test module in which a bypass path is selected by MUX 21, the test data inputted from SI terminal 201 is directly outputted to SO terminal 204 from multiplexer 21 bypassing scan path 10. Accordingly, the bit length in a transmission path of test data is reduced to the number of stages of required SRLs to reduce the number of testing of test data. It shortens time of setting test data. Upon arrival of test data at each SRL in a given scan path 10, input of test data and shifting operation of SRL are stopped.

b) Provision of Test Data

An update signal is raised to a H level, and test data held in 2-input data latch 31 of a SRL is captured and held by data latch 32. The test data held in 2-input data latch 32 is provided to an input terminal of a corresponding BUT 40 through data output terminal DO. A BUT 40 provided with the test data processes the test data according to its internal logic structure and outputs test result data to its output terminal.

c) Capturing of Test Result Data

A strobe signal STB is raised to a H level. Thus, in a SRL connected to an output terminal of BUT 40, test result data provided through data input terminal DI is captured and held by 2-input data latch 31.

d) Shift-Out of Test Result Data

Shift clock signals SCLK1 and SCLK2 are provided as non-overlapping two-phase clocks signals. As a result, the test result data held by 2-input data latch 31 of a SRL is shifted through data latch 33 and outputted to SO terminal 39. At this time, selection data holding latch 22 is holding selection data, so that in a test module in which a bypass path is selected, scan path 10 does not perform shift operation, where a bypassing path of data is formed. Accordingly, also in shift-out of test result data, similarly to the above-described shift-in of test data, a required scan path 10 only performs shifting operation to reduce a bit length of a data transmission path. Accordingly, the shift-out time of test result data is reduced. The shifted test result data is externally outputted from SO terminal 602.

Above-described test operations are repeatedly executed changing patterns of test data. Also, the testing is executed about all the test modules 50a-50c.

Analyzing and verifying the test result data outputted from SO terminal 602 outside thereof, presence and absence of abnormality inside integrated circuit device 60 can be diagnosed.

Now, IEEE (The Institute of Electrical and Electronics Engineers, Inc.) defines various standards for standardization of test design using a boundary scan. The standards are described in detail in IEEE Std. 1149.1-1990; published by the Institute of Electrical and Electronics Engineering, inc., 345 East 47th street, New York, N.Y. 10017, USA. May 21, 1990. In the standards, sorts and number of signals used for testing, circuit configuration inside an integrated circuit device, and the like are clearly defined.

FIG. 19 is a block diagram illustrating structure of an integrated circuit device in which the test module shown in FIG. 17 and a test controller required for the boundary scan test defined in the standard of IEEE 1149.1 are incorporated. In the figure, a test controller 70 is connected to a TCK terminal 621, a TMS terminal 622, a TDI terminal 623, a TRST terminal 624 and a TDO terminal 625. A test clock signal is inputted from TCK terminal 621. A test mode signal is inputted from TMS terminal 622. A test reset signal is inputted from TRST terminal 624. Test controller 70 generates a group of control signals and a reset signal on the basis of these test clock signal, test mode signal and test reset signal. The group of control signals and the reset signal are applied to each of test modules 50a-50c. Selection data and test data are inputted from TDI terminal 623, which passes test controller 70 and are applied to SI terminal 501 of test module 50a from SO terminal 701. The test result data obtained from SO terminal 504 of test module 50c is externally outputted from TDO terminal 625 after passing through test controller 70. A mode latch signal supplied to test modules 50a-50c can not be generated by test controller 70, so that it must be directly inputted from outside through an input terminal 605. This is because the boundary scan test defined by the IEEE 1149.1 did not anticipate appearance of a scan path having a bypass path.

In the standard of IEEE 1149.1, sorts of pins provided in an LSI chip for testing are limited to five sorts, TCK terminal 621, TMS terminal 622, TDI terminal 623, TRST terminal 624 and TDO terminal 625. Accordingly, the integrated circuit device 61 in FIG. 19 having input terminal 605 for a mode latch signal has a structure which does not meet with the standard of IEEE 1149.1.

The operation of integrated circuit device 61 shown in FIG. 19 is substantially the same as operation of the integrated circuit device 60 shown in FIG. 18, so that the description thereof is not repeated.

A conventional bypass scan path configured as described above has a large number of signals for controlling a bypass scan path. Accordingly, it had a problem of an increase of the number of terminals of an LSI chip and an increase of the number of interconnections inside. Also, when using a conventional bypass scan path as an internal test aids circuit for an integrated circuit device introducing an IEEE 1149.1 boundary scan which is a board level standard test method, a terminal 605 for inputting a mode latch signal has to be separately provided in an LSI chip, so that there existed a problem that the integrated circuit device does not meet with the standard of the IEEE 1149.1. As the result, it had disadvantages that commercially available CAD tools (test pattern producing software for boundary scan and the like) can not be used and that board test according to the standard (a method of packaging a plurality of LSI chips on a board and testing the plurality of LSI chips simultaneously) can not be performed, either.

SUMMARY OF THE INVENTION

It is an object of the present invention to provide a bypass scan path capable of reducing the number of control signals and an integrated circuit device using the same.

It is another object of the present invention to provide a bypass scan path applicable to the standard of boundary scan testing of the IEEE 1149.1 and an integrated circuit device using the same.

A bypass scan path according to the present invention is employed in an integrated circuit device in which at least one control point and at least one observation point exist inside, which transmits control point data inputted from outside and applies the data to a control point, and transmits observation point data obtained from a observation point and externally outputs the data. A bypass scan path according to the present invention includes a single data input terminal, a single data output terminal, shift register means, and scan path selecting means. The data input terminal serially inputs selection data for selecting a transmission path of data and control point data, respectively. The data output terminal serially outputs observation point data. Shift register means includes at least one shift register latch connected in series each connected to a control point and/or an observation point, respectively, which is interposed between the data input terminal and the data output terminal to shift and hold control point data and observation point data. The scan path selecting means selects either one of a shift path passing through the shift register means and a bypass path bypassing the shift register means as a data transmission path between the data input terminal and the data output terminal on the basis of selection data inputted from the data input terminal, of which operation is controlled only by a reset signal and a group of control signals for the shift register means.

An integrated circuit device according to the present invention includes a plurality of control points and a plurality of observation points inside, which includes a single external data input terminal, a single external data output terminal and a plurality of bypass scan paths. The external data input terminal serially inputs selection data for selecting a transmission path of data and control point data to be supplied to a control point, respectively. The external data output terminal outputs serially observation point data obtained from a observation point. The plurality of bypass scan paths are connected in a series manner between the external data input terminal and the external data output terminal, to form a serial transmission path with respect to selection data, control point data and observation point data. Each bypass scan path includes a single internal data input terminal, a single internal data output terminal, shift register means and scan path selecting means. The internal data input terminal serially inputs selection data and control point data, respectively. The internal data output terminal serially outputs observation point data. Shift register means includes at least one shift register latch connected in series each coupled with a control point and/or observation point, respectively, which is interposed between the internal data input terminal and the internal data output terminal to shift and hold control point data and observation point data. The scan path selecting means selects either one of a shift path passing through the shift register means and a bypass path bypassing the shift register means as a data transmission path between the internal data input terminal and the internal data output terminal on the basis of selection data inputted from the internal data input terminal, of which operation is controlled only by a reset signal and a group of control signals for the shift register means. Each bypass scan path applies inputted control point data to a control point after it is shifted by the shift register means when a shift path is selected by a scan path selecting means, and/or captures observation point data obtained from an observation point into the shift register means and then shifts and outputs the same from the internal data output terminal.

In the present invention, the operation of the scan path selecting means in a bypass scan path is controlled only by a reset signal and a group of control signals for the shift register means. Accordingly, it is not necessary to introduce a mode latch signal from outside, so that the number of terminals and interconnections can be reduced. Also, since these reset signal and the group of control signals for the shift register means are signals which can be generated by a test controller defined in the IEEE 1149.1, an integrated circuit device in which a bypass scan path of the present invention is incorporated can be applied to the standard of the boundary scan test of the IEEE 1149.1.

Although the present invention has been described and illustrated in detail, it is clearly understood that the same is by way of illustration and example only and is not to be taken by way of limitation, the spirit and scope of the present invention being limited only by the terms of the appended claims.

DESCRIPTION OF THE PREFERRED EMBODIMENTS

The present invention will be described in more detail below referring to the figures. The present invention is characterized in that a part of a group of control signals inputted for controlling SRLs are used as mode latch signals in substitution. In each embodiment described below, an update signal UD is substituted for a mode latch signal.

Figure 1:
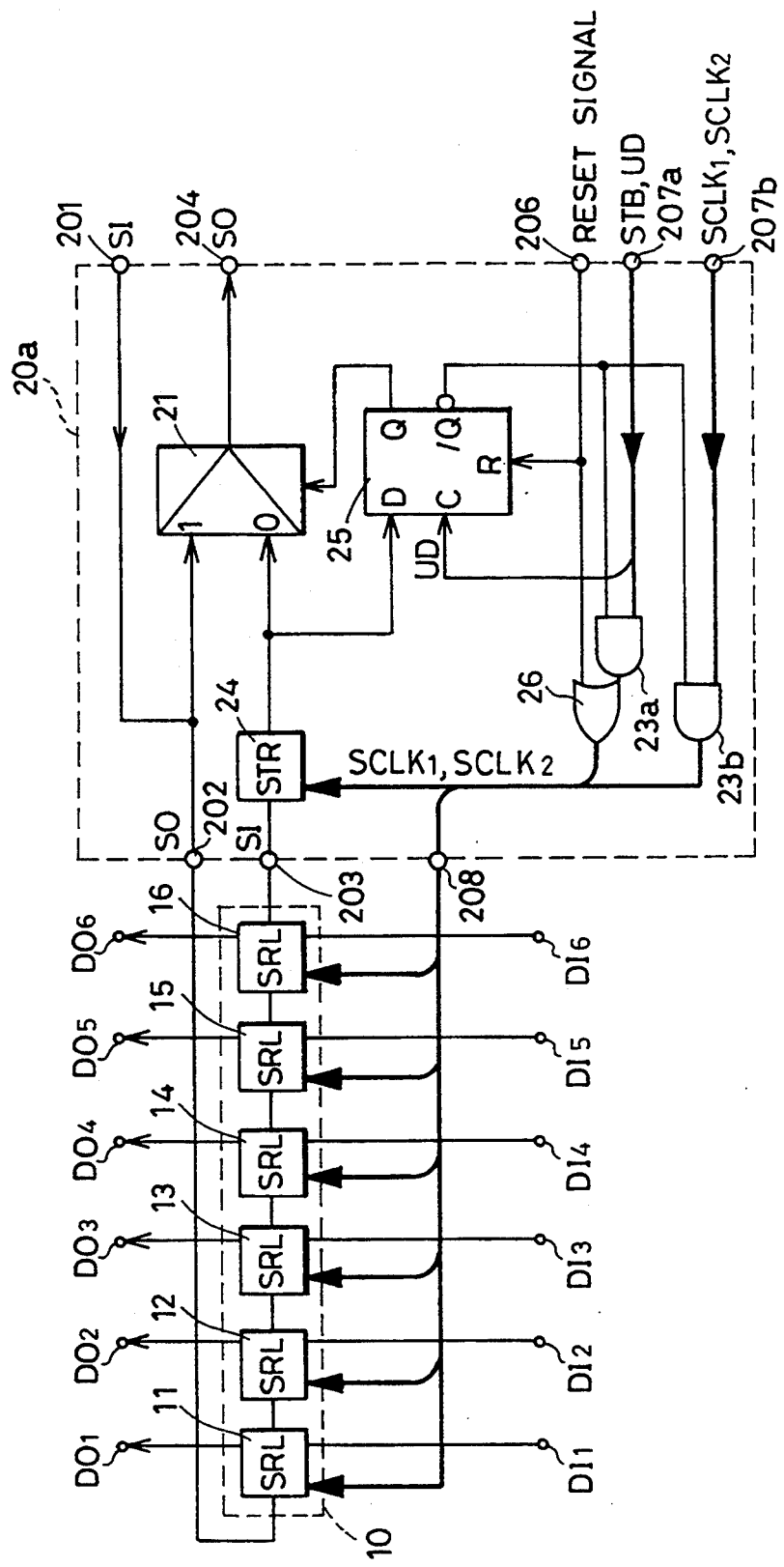
FIG. 1 is a block diagram illustrating structure of a bypass scan path of the first embodiment of the present invention.
Figure 13:
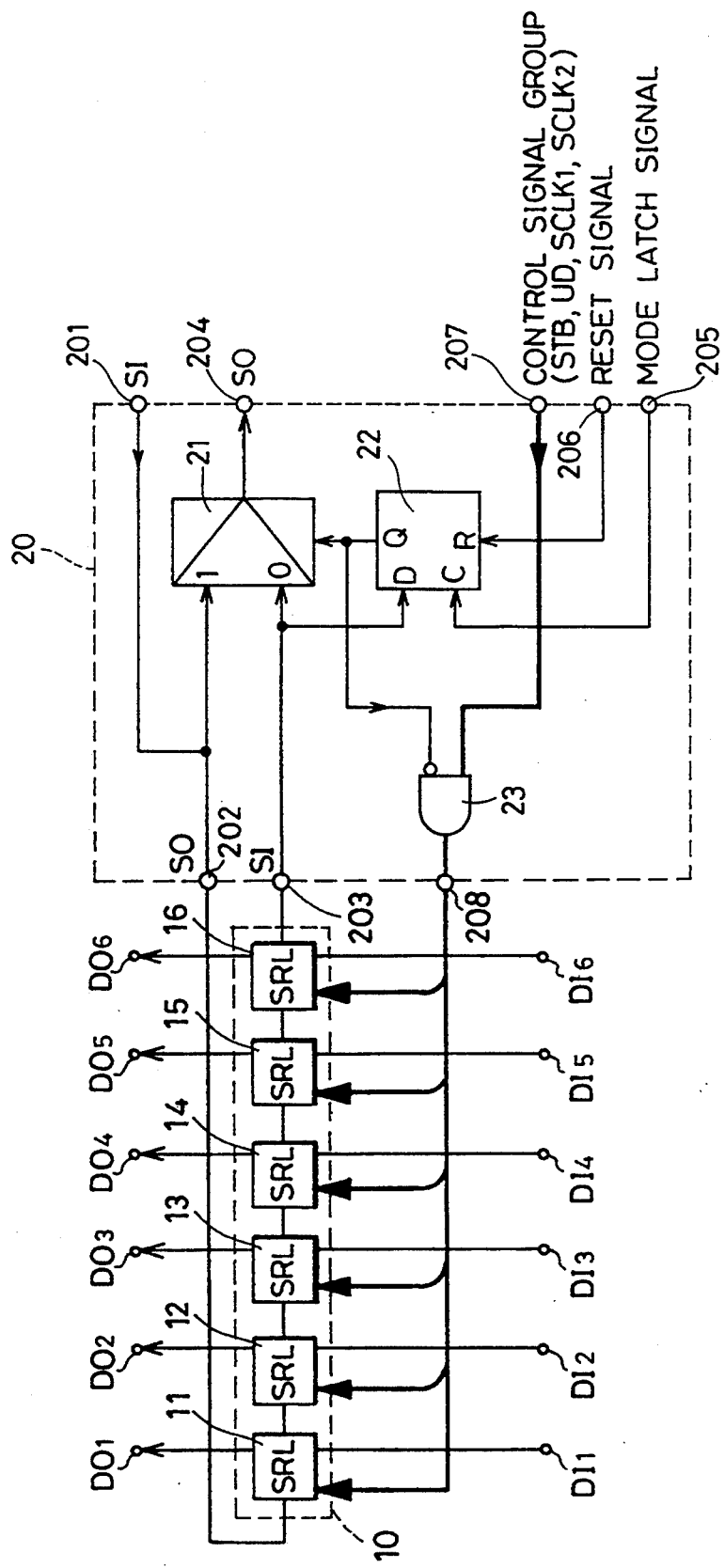
FIG. 13 is a block diagram illustrating structure of a conventional bypass scan path.

FIG. 1 is a block diagram illustrating configuration of a bypass scan path of the first embodiment of the present invention. In the figure, the embodiment includes a scan path 10 and a scan path selecting circuit 20a. In scan path selecting circuit 20a, a selection data transmitting register (hereinafter referred to as a STR) 24 is interposed between a SI terminal 203 and an input terminal of a multiplexer 21. In place of the selection data holding latch 22 in FIG. 13, a selection data holding latch 25 provided with an inversion output terminal is provided. A data input terminal D of selection data holding latch 25 is connected to an output of a STR 24. Accordingly, selection data holding latch 25 captures and holds selection data set in STR 24. An output signal of an output terminal Q of selection data holding latch 25 is applied to a control terminal of multiplexer 21 as a selection control signal. An output signal of an inversion output terminal /Q of selection data holding latch 5 is applied to each one input terminal of each of AND gates 23a and 23b. A reset signal is applied from an input terminal 206 to a reset terminal R of selection data holding latch 25. A strobe signal STB and an update signal UD are provided to the other input terminal of AND gate 23a from an input terminal 207a. Shift clock signals SCLK1 and SCLK2 are applied to the other input terminal of AND gate 23b from an input terminal 207b. An output of AND gate 23a is applied to one input terminal of an OR gate 26. A reset signal is applied from input terminal 206 to the other input terminal of OR gate 26. And gate 23a and OR gate 26 are individually provided for each of strobe signal STB and update signal UD. Similarly, AND gate 23b is individually provided for shift clock signals SCLK1 and SCLK2, respectively. A strobe signal STB and an update signal UD outputted from OR gate 26 and shift clock signals SCLK1 and SCLK2 outputted from AND gate 23b are applied to each of SRLs 11–16 through an output terminal 208. Also, shift clock signals SCLK1 and SCLK2 outputted from AND gate 23b are applied to STR 24. Other structure of the embodiment shown in FIG. 1 is the same as the structure of the conventional bypass scan path shown in FIG. 13, and the same reference numerals are assigned to corresponding portions and the description thereof is not repeated.

Figure 2:
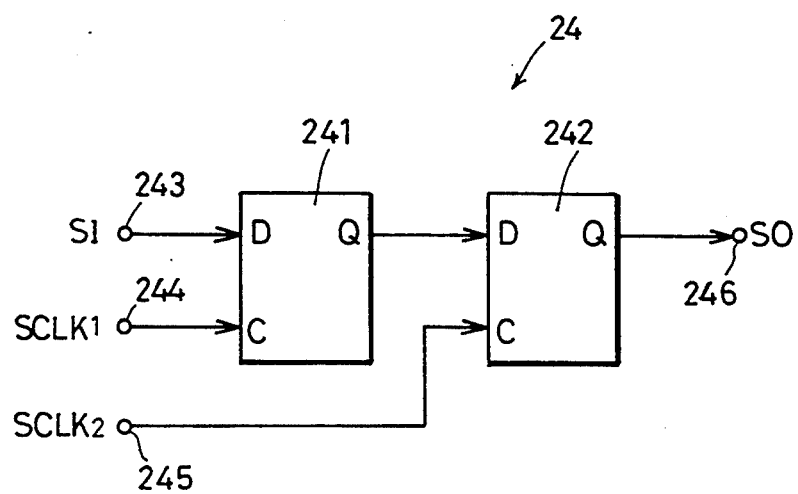
FIG. 2 is a block diagram illustrating one example of structure of the STR 24 shown in FIG. 1.

FIG. 2 is a block diagram illustrating one example of structure of the STR 24 shown in FIG. 1. In the figure, STR 24 includes two data latches 241 and 242. A data input terminal D of data latch 241 is connected to a SI terminal 203 in FIG. 1 through a SI terminal 243. A shift clock signal SCLK 1 is applied to a clock signal input terminal C of data latch 241 through an input terminal 244 from an OR gate 26. An output signal of an output terminal Q of data latch 241 is applied to a data input terminal D of data latch 242. A shift clock signal SCLK2 is applied from OR gate 26 through an input terminal 245 to a clock signal input terminal C of data latch 242. An output signal of an output terminal Q of data latch 242 is applied to a SO terminal 246. SO terminal 246 is connected to an input terminal of multiplexer 21 and a data input terminal D of selection data holding latch 25.

Such a STR 24, when provided with shift clock signals SCLK1 and SCLK2 as non-overlapping two-phase clock signals, shifts a serial signal inputted from SI terminal 243 and outputs the signal from SO terminal 246.

Figure 3:
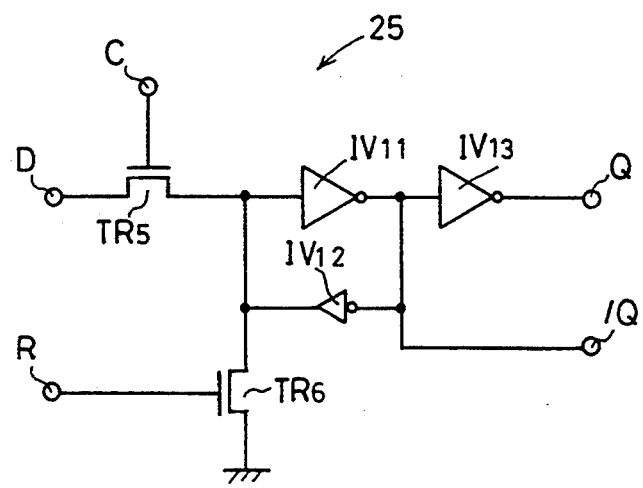
FIG. 3 is a circuit diagram illustrating one example of structure of select data holding latch 25 shown in FIG. 1.
Figure 16:
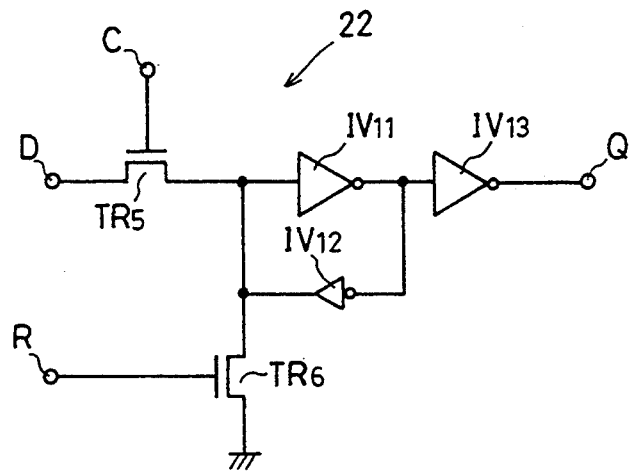
FIG. 16 is a circuit diagram illustrating one example of structure of the selection data holding latch 22 shown in FIG. 13.

FIG. 3 is a circuit diagram illustrating one example of structure of the selection data holding latch 25 shown in FIG. 1. In the figure, similarly to the selection data holding latch 22 shown in FIG. 16, selection data holding latch 25 includes N channel MOS transistors TR5 and TR6 and inverters IV11–IV13. An output of inverter IV11 is applied to an inversion output terminal /Q. Other structure is the same as that of the selection data holding latch 22 shown in FIG. 16.

Figure 4:
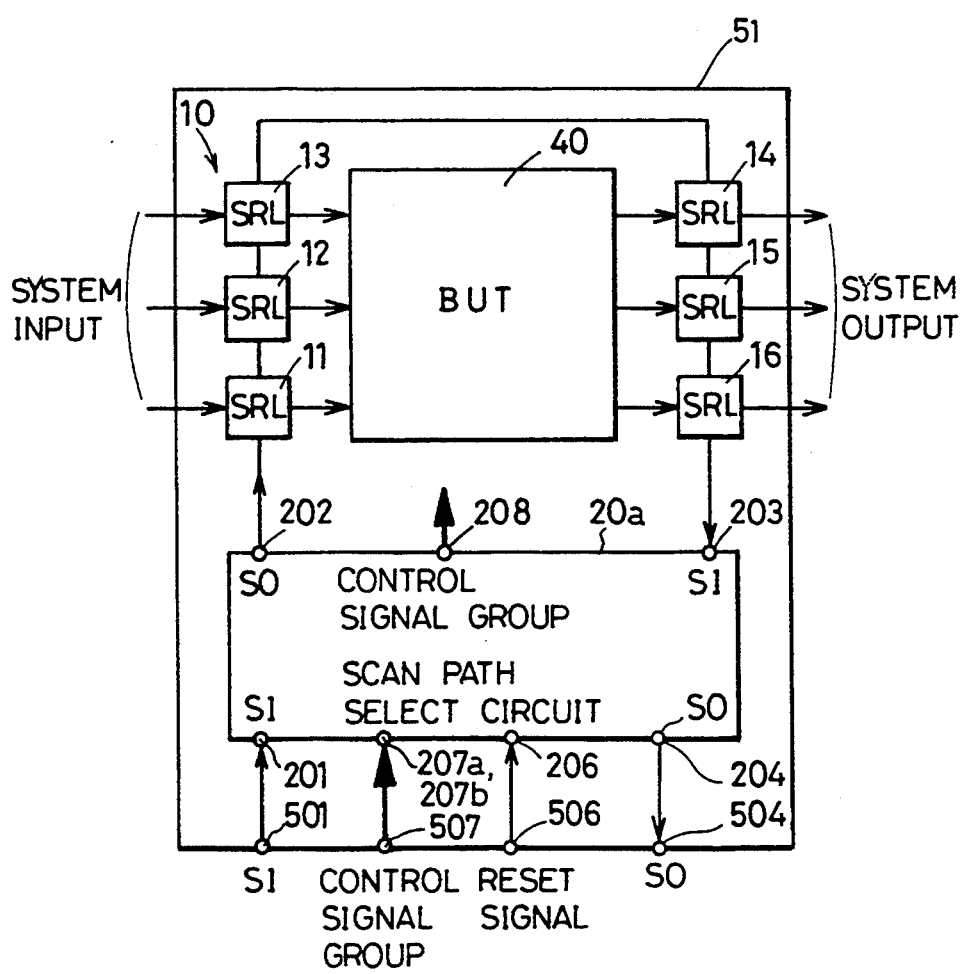
FIG. 4 is a block diagram illustrating one example of structure of a test module incorporating the bypass scan path shown in FIG. 1.
Figure 17:
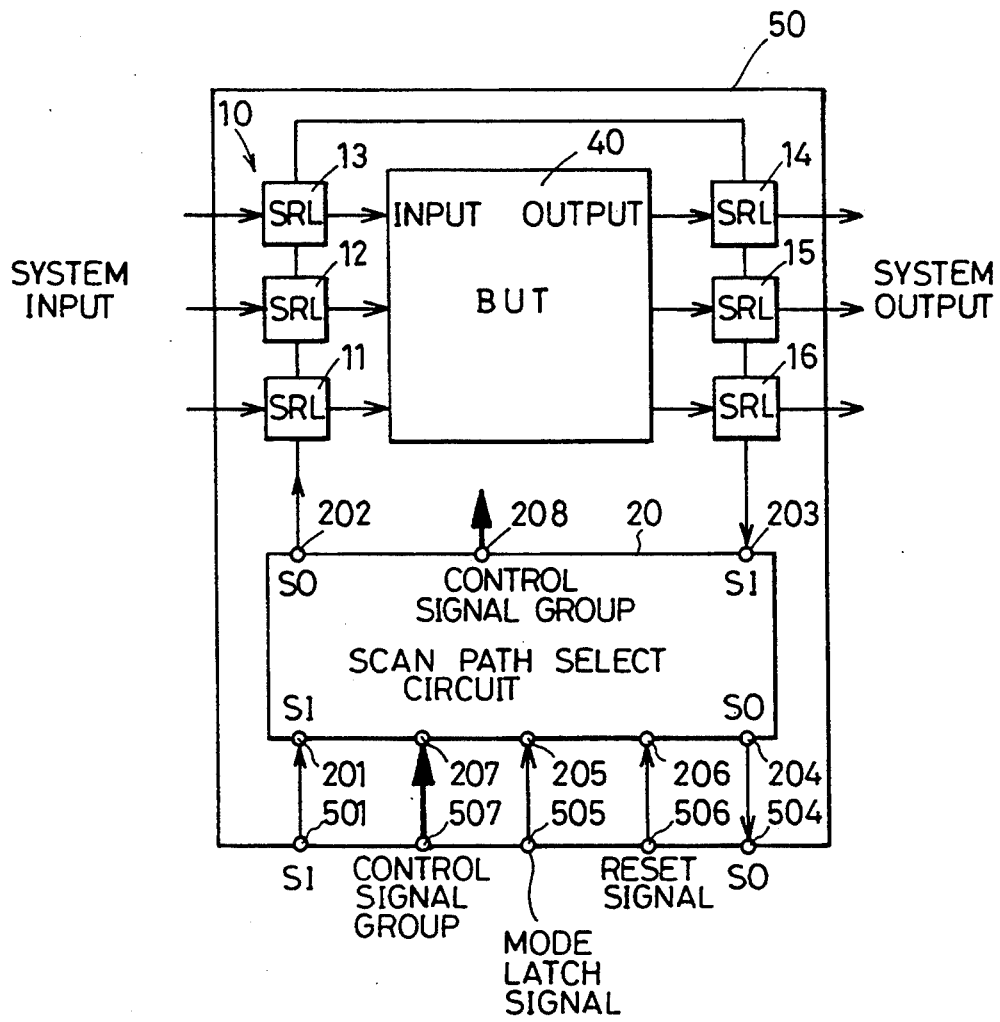
FIG. 17 is a block diagram illustrating one example of structure of a test module incorporating the bypass scan path shown in FIG. 13.

FIG. 4 is a block diagram illustrating structure of a test module incorporating a test aids circuit by the bypass scan path shown in FIG. 1. In the figure, test module 51 includes a scan path 10 in which SRLs 11–16 are connected in series, a scan path selecting circuit 20a and a BUT 40. SRLs 11–13 are connected to input terminals of BUT 40 and SRLs 14–16 are connected to output terminals of BUT 40. An input terminal 507 of test module 51 to which a group of control signals are inputted is connected to input terminals 207a and 207b in scan path selecting circuit 20a. Strobe signals STB, UD are supplied to input terminal 207a from input terminal 507 and shift clock signals SCLK1 and SCLK2 are supplied to input terminal 207b from input terminal 507. The input terminal 505 for inputting a mode latch signal as shown in FIG. 17 is not provided in test module 51.

Figure 5:
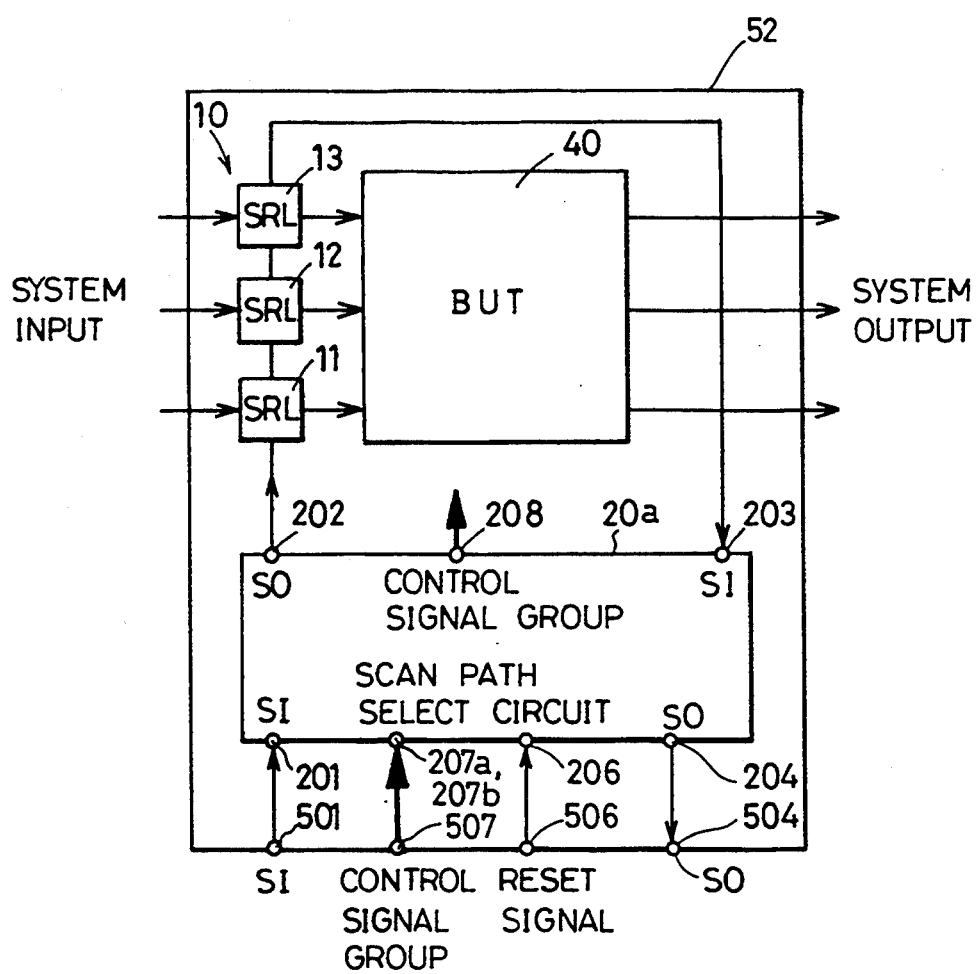
FIG. 5 is a block diagram illustrating another example of structure of a test module.

FIG. 5 is a block diagram illustrating another structure of a test module. In the figure, a scan path is formed of three SRLs 11–13 connected in series. These SRLs 11–13 are connected to input terminals of BUT 40.

As seen from FIGS. 4 and 5, the number of SRLs forming a scan path can be any number. Also, each SRL may be connected to only one of an input terminal and an output terminal of BUT 40 or may be connected to both of them.

Figure 6:
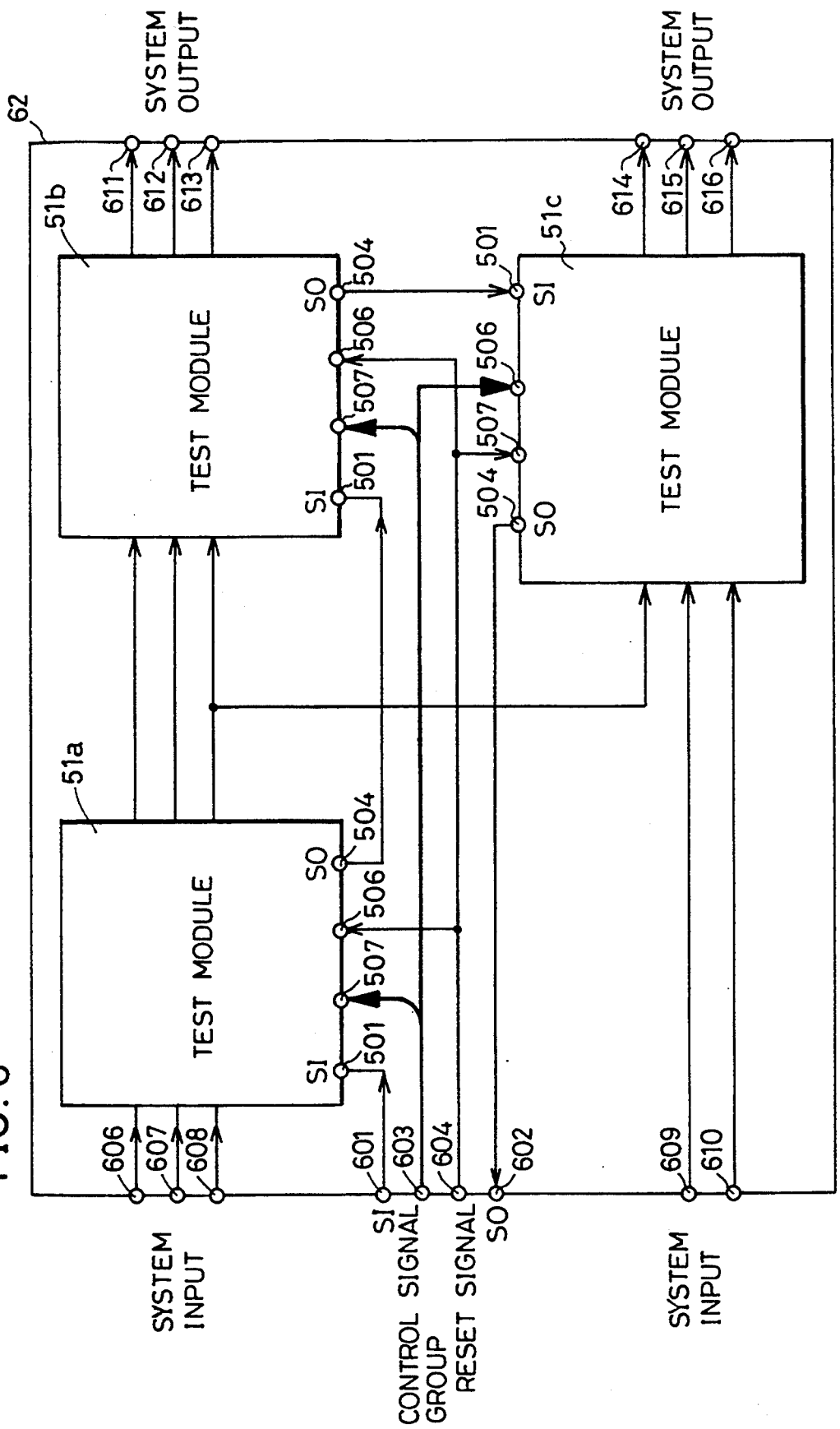
FIG. 6 is a block diagram illustrating one example of structure of an integrated circuit device incorporating the test module shown in FIG. 4.
Figure 18:
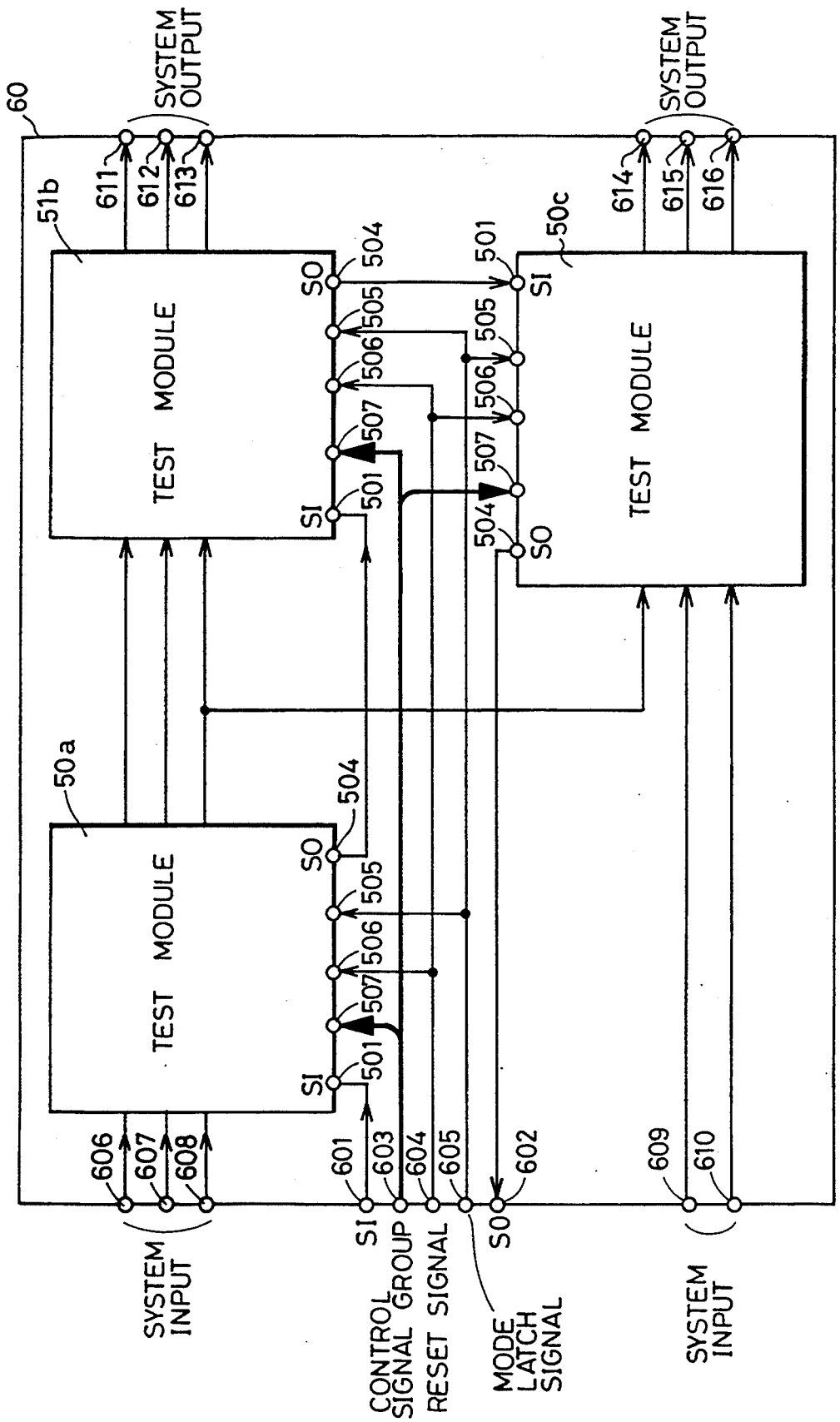
FIG. 18 is a block diagram illustrating one example of structure of an integrated circuit device incorporating the test module shown in FIG. 17.

FIG. 6 is a block diagram illustrating one example of structure of an integrated circuit device incorporating the test module shown in FIG. 4. In the figure, inside integrated circuit device 62, three test modules 51a–51c are provided, for example. The structure of each of test modules 51a–51c is the same as that of test module 51 shown in FIG. 4. Respective test modules are connected in series between a SI terminal 601 and a SO terminal 602 with respect to selection data and test data. Other structure of the integrated circuit device 62 shown in FIG. 6 is the same as that of the conventional integrated circuit device 60 shown in FIG. 18. However, in the integrated circuit device 62, an input terminal 605 for inputting a mode latch signal is not provided.

Next, operation of the integrated circuit device shown in FIG. 6 will be described.

(1) Operation in Normal Mode

Figure 14:
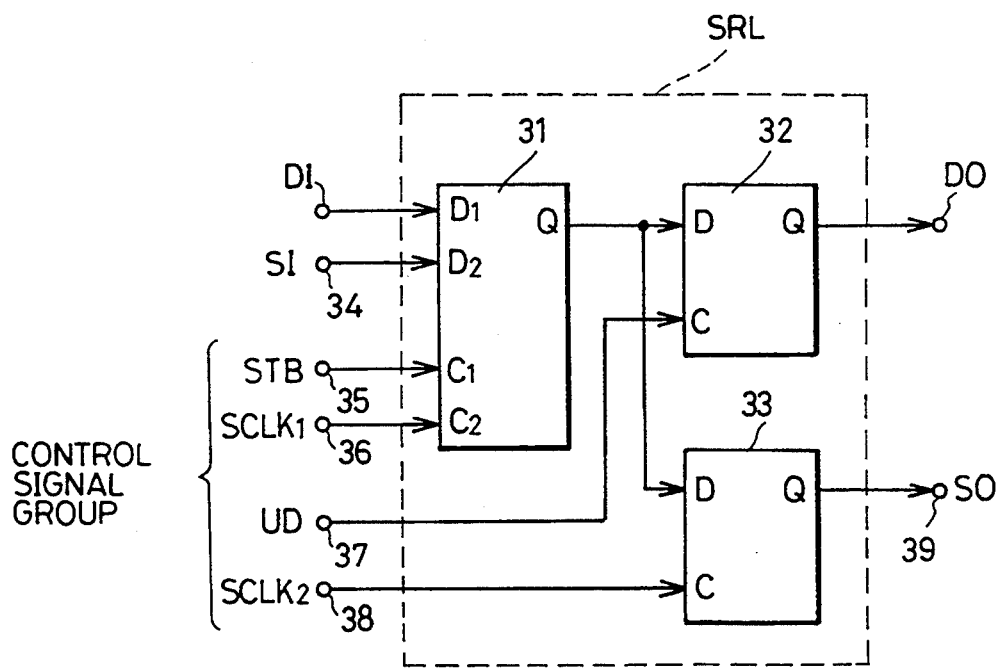
FIG. 14 is a block diagram illustrating one example of structure of the SRL shown in FIG. 13.
Figure 15:
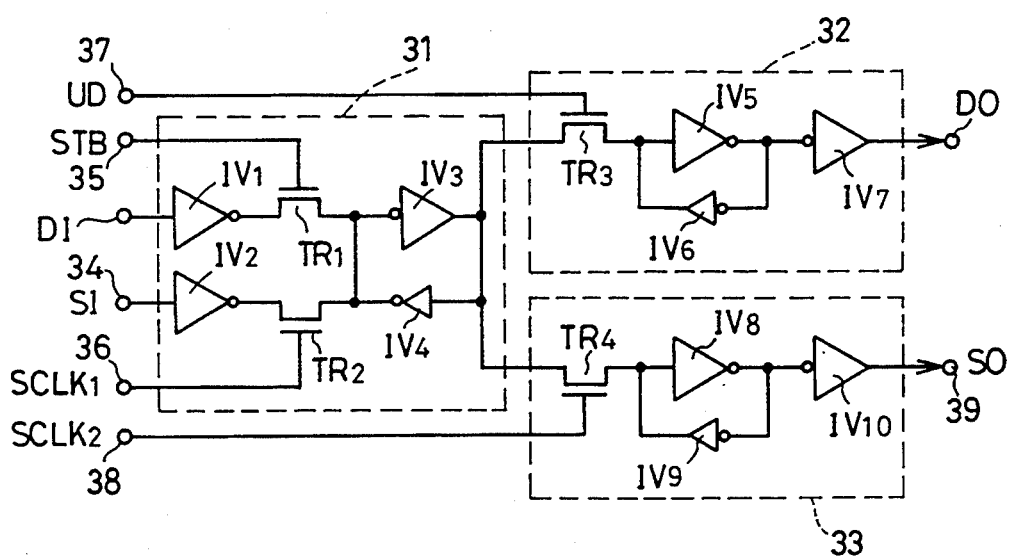
FIG. 15 is a circuit diagram illustrating further detailed structure of the SRL shown in FIG. 14.

A reset signal is fixed at a H level and shift clock signals SCLK1 and SCLK2 are fixed at a L level. Fixing the reset signal at a H level, strobe signal STB and update signal UD applied to each of SRLs 11–16 from OR gate 26 are fixed to a H level. Accordingly, 2-input data latch 31, data latch 32 (refer to FIG. 14) in each of SRLs 11–16 merely operate as an non-inversion driver. As a result, in each of SRLs 11–16, a transmissive state, i.e., a data through state is implemented between data input terminals DI1–DI6 and data output terminals DO1–DO6. Accordingly, system data inputted from input terminals 606–610 are transmitted without any problem and processed in a BUT 40 in each test module.

(2) Operation in Test Mode

Figure 7:
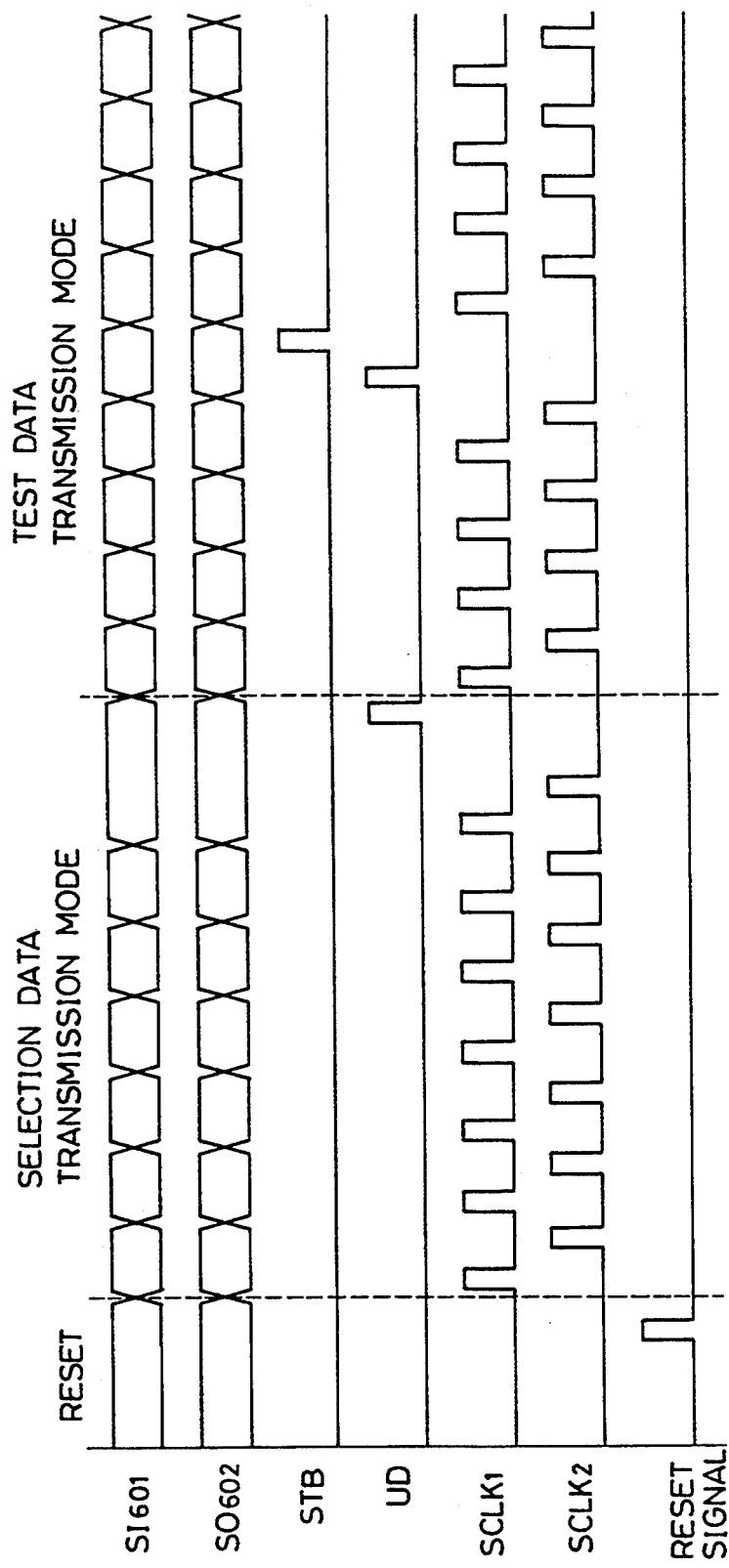
FIG. 7 is a timing chart for describing operation of the embodiment shown in FIG. 6.

Referring to the timing chart of FIG. 7, operation in the test mode will be described below.

<1> Reset

A reset signal is raised to an active level, for example a H level, and selection data holding latch 25 in scan path selection circuit 20a is reset. Thus, an output signal of output terminal Q of selection data holding latch 25 attains a L level and multiplexer 21 selects an output of STR 24. That is, a scan path is selected as a data transmission path. On the other hand, an output signal of inversion output terminal /Q of selection data holding latch 25 attains a H level. Accordingly, a strobe signal STB and an update signal UD passes through AND gate 23a and OR gate 26 to be applied to each of SRLs 11–16. Also, shift clock signals SCLK1 and SCLK2 pass through AND gate 23b to be supplied to each of SRLs 11–16 and STR 24. As a result, scan path 10 and STR 24 come in a data transmittable state.

<2> Transmission of Selection Data a) Shift-In of Selection Data

Selection data is serially inputted from SI terminal 601. At this time, shift clock signals SCLK1 and SCLK2 are applied as non-overlapping two-phase clock signals. Accordingly, each SRL 11–16 in scan path 10 shifts selection data inputted from SI terminal 34 by alternate latch operations of 2-input data latch 31 and data latch 33. Also, STR 24 shifts selection data inputted from SI terminal 243 to SO terminal 246 by alternate latch operations of data latches 241 and 242. Similarly to a conventional integrated circuit device, selection data is inputted together with dummy data. Upon arrival of selection data at STR 24 in each of test modules 51a–51c, input of selection data is stopped and shift clock signals SCLK1 and SCLK2 are fixed to a L level to stop shifting operation of each SRL 11–16. Thus, selection data is held in STR 24 in each of test modules 51a–51c and dummy data is held in SRLs 11–16.

b) Capturing of Selection Data

An update signal UD is raised to a H level. Thus, selection data holding latch 25 captures and latches selection data set in STR 24. When selection data holding latch 25 latches selection data "0", since an output signal of output terminal Q of selection data holding latch 25 attains a L level, multiplexer 21 selects an output signal of STR 24. At this time, a scan path is selected as a transmission path of data. On the other hand, when selection data holding latch 25 latches selection data "1", since an output signal of output terminal Q of selection data holding latch 25 attains a H level, multiplexer 21 selects an input signal from SI terminal 201. At this time, a bypass path is selected as a transmission path of data.

<3> Transmission of Test Data a) Shift-In of Test Data

Test data is serially inputted from SI terminal 601. Also, test clock signals SCLK1 and SCLK2 are applied as non-overlapping two-phase clock signals. In a scan path in which selection data holding latch 25 latches selection data "0", since an output signal of inversion output terminal/Q of selection data holding latch 25 attains a H level, AND gate 23b supplies shift clock signals SCLK1 and SCLK2 to each of SRLs 11–16 and STR 24. Accordingly, scan path 10 and STR 24 comes in a data transmittable state. On the other hand, in a bypass scan path in which selection data hold latch 25 latches selection data "1", an output signal of inversion output terminal/Q of selection data holding latch 25 attains a L level, so AND gate 23b does not supply shift clock signals SCLK1 and SCLK2 to each of SRLs 11–16 and STR 24. Accordingly, scan path 10 and STR 24 come in a data untransmittable state.

In a bypass scan path in which a scan path is selected by selector 21, scan path 10 and STR 24 sequentially shift test data inputted from SI terminal 201 and output the data to SO terminal 204. In a bypass scan path in which a bypass path is selected by selector 21, test data inputted from SI terminal 201 bypasses scan path 10 and STR 24 to be directly outputted to SO terminal 204.

Upon arrival of test data at a SRL coupled to BUT 40 which is an objective of testing, input of test data is stopped. Also, shift clock signals SCLK1 and SCLK2 are fixed at a L level and shifting operations of SRLs 11–16 and STR 24 are stopped. Accordingly, test data is set in a SRL in a given scan path 10. In a bypass scan path in which multiplexer 21 selects a scan path, selection data "0" is re-set in STR 24. The selection data "0" is serially inputted from SI terminal 601 together with test data.

b) Provision of Test Data

An update signal UD is raised to a H level and test data held in 2-input data latch 31 of a SRL is captured and held by data latch 32. The test data held by data latch 32 is applied to an input terminal of a corresponding BUT 40 through data output terminal DO. BUT 40 to which test data is applied processes the test data according to its internal logic structure to output the test result data from its output terminal. When the update signal UD is raised to a H level, selection data holding latch 25 in each bypass scan path captures and latches selection data set in STR 24. At this time, in a bypass scan path in which a bypass path is selected as a data transmission path, since test data does not pass through STR 24 in shift-in of test data, the selection data set in STR 24 remains "1". On the other hand, in a bypass scan path in which a scan path is selected as a data transmission path, selection data "0" is set again in STR 24 in shift-in of test data. Accordingly, even if update signal UD rises to a H level for providing test data, the logic of selection data held in selection data holding latch 25 does not change.

c) Capturing of Test Result Data

A strobe signal STB is raised to a H level. Thus, in a SRL connected to an output terminal of BUT 40, test result data provided through data input terminal DI is captured and held in 2-input data latch 31.

d) Shift-Out of Test Result Data

Shift clock signals SCLK1, SCLK2 are provided as non-overlapping two-phase clock signals. As a result, the test result data held in SRL and selection data held in STR 24 are sequentially shifted to be outputted to SO terminal 204. At this time, in a bypass scan path in which a bypass path is selected as a data transmission path, test result data inputted from SI terminal 201 bypasses scan path 10 and STR 24 to be outputted directly to SO terminal 204 from multiplexer 21. As a result, the data transmission path is shortened. Serial test result data can be obtained from SO terminal 602.

Figure 8:
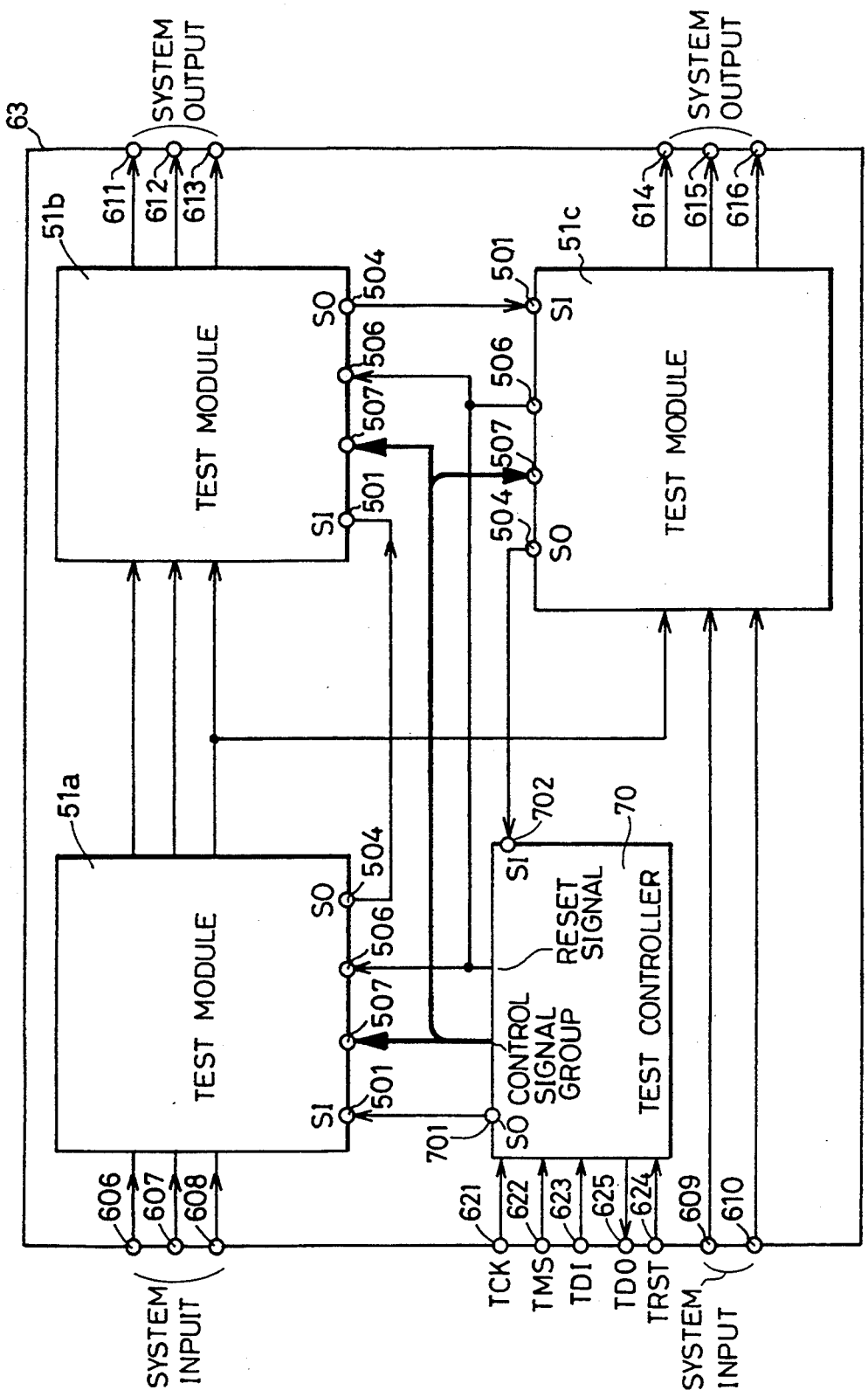
FIG. 8 is a block diagram illustrating another example of structure of an integrated circuit device incorporating the test module shown in FIG. 4.
Figure 19:
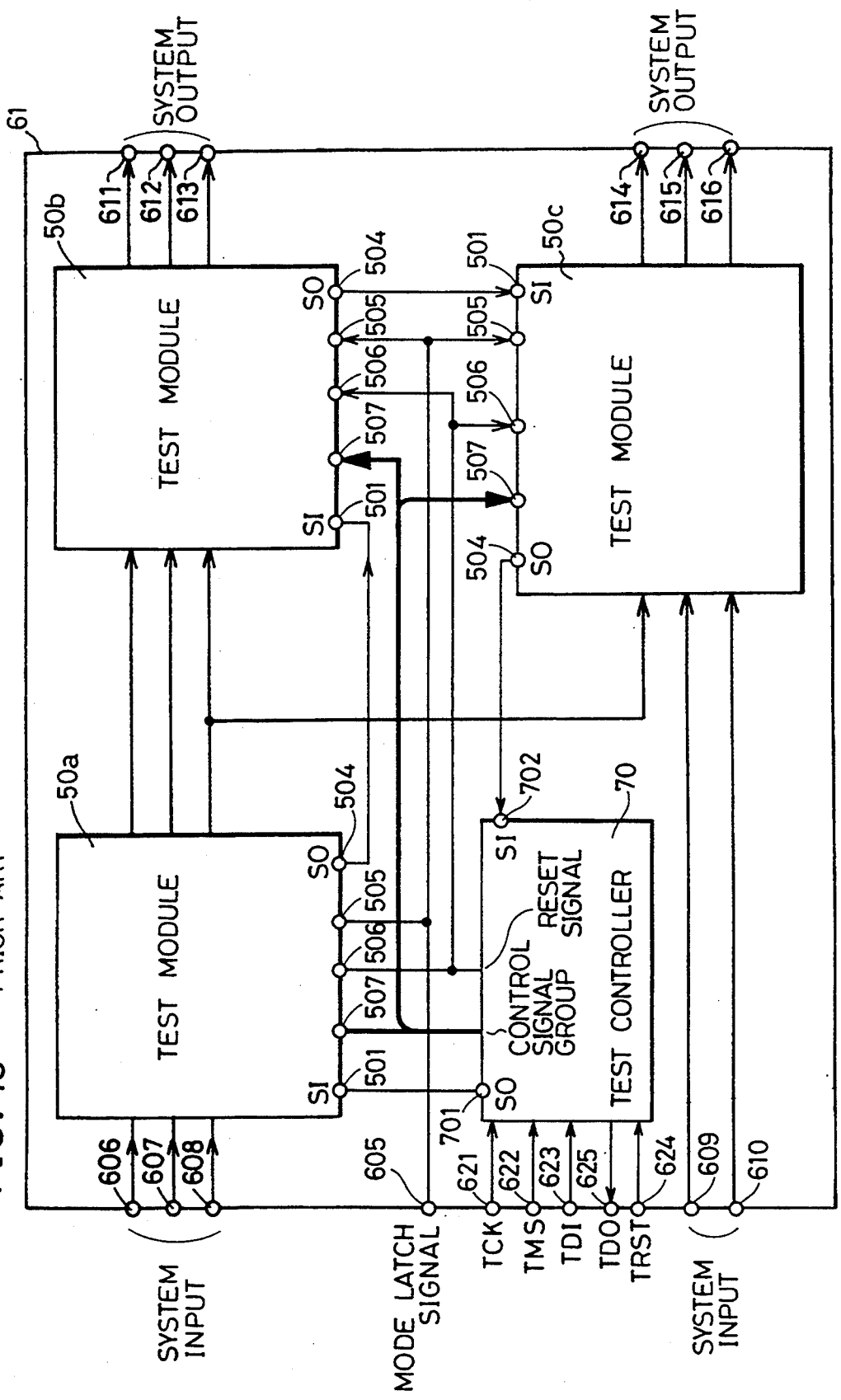
FIG. 19 is a block diagram illustrating another example of structure of an integrated circuit device incorporating the test mode shown in FIG. 17.

FIG. 8 is a diagram illustrating structure of another integrated circuit device incorporating the test module shown in FIG. 4. In the figure, an integrated circuit device 63 includes a test controller 70 defined by the IEEE 1149.1 inside. The test controller 70 generates a group of control signals and a reset signal on the basis of signals inputted from a TCK terminal 621, a TMS terminal 622 and TRST terminal 624 and provides them to each of test modules 51a–51c. In integrated circuit device 63, an input terminal 605 for inputting a mode latch signal as shown in FIG. 19 is not provided. Accordingly, the integrated circuit device 63 shown in FIG. 8 is completely adapted to the standard of the boundary scan test of the IEEE 1149.1.

Figure 9:
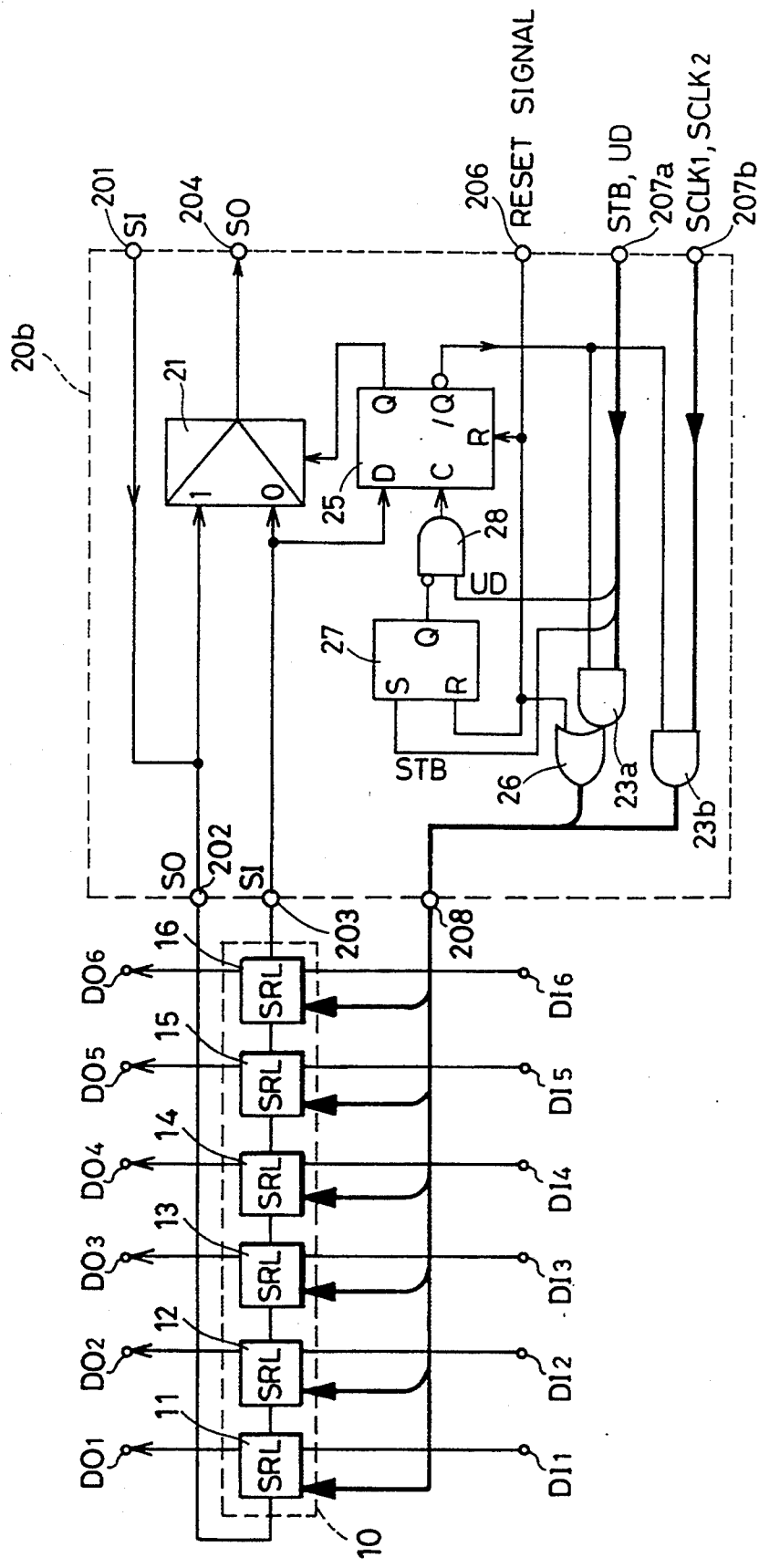
FIG. 9 is a block diagram illustrating structure of a bypass scan path of the second embodiment of the present invention.

FIG. 9 is a block diagram illustrating configuration of a bypass scan path of the second embodiment of the present invention. In the embodiment shown in FIG. 9, a STR 24 as shown in FIG. 1 is not provided. Accordingly, selection data holding latch 25 captures and holds selection data set in SRL 16. Scan path selecting circuit 20b further includes a RS flipflop 27 and an AND gate 28. A strobe signal STB is applied from input terminal 207a to a set input terminal S of RS flipflop 27. A reset signal is applied to a reset input terminal R of RS flipflop 27 from an input terminal 206. An output signal of an output terminal Q of RS flipflop 27 is inverted and then applied to one input of AND gate 28. An update signal UD is applied from input terminal 207a to the other input of AND gate 208. An output signal of AND gate 28 is applied to a clock signal input terminal C of selection data holding latch 25. Other structure of the embodiment shown in FIG. 9 is the same as the structure of the embodiment shown in FIG. 1, where the same reference numerals are assigned to corresponding portions and a description thereof is not repeated.

Figure 10:
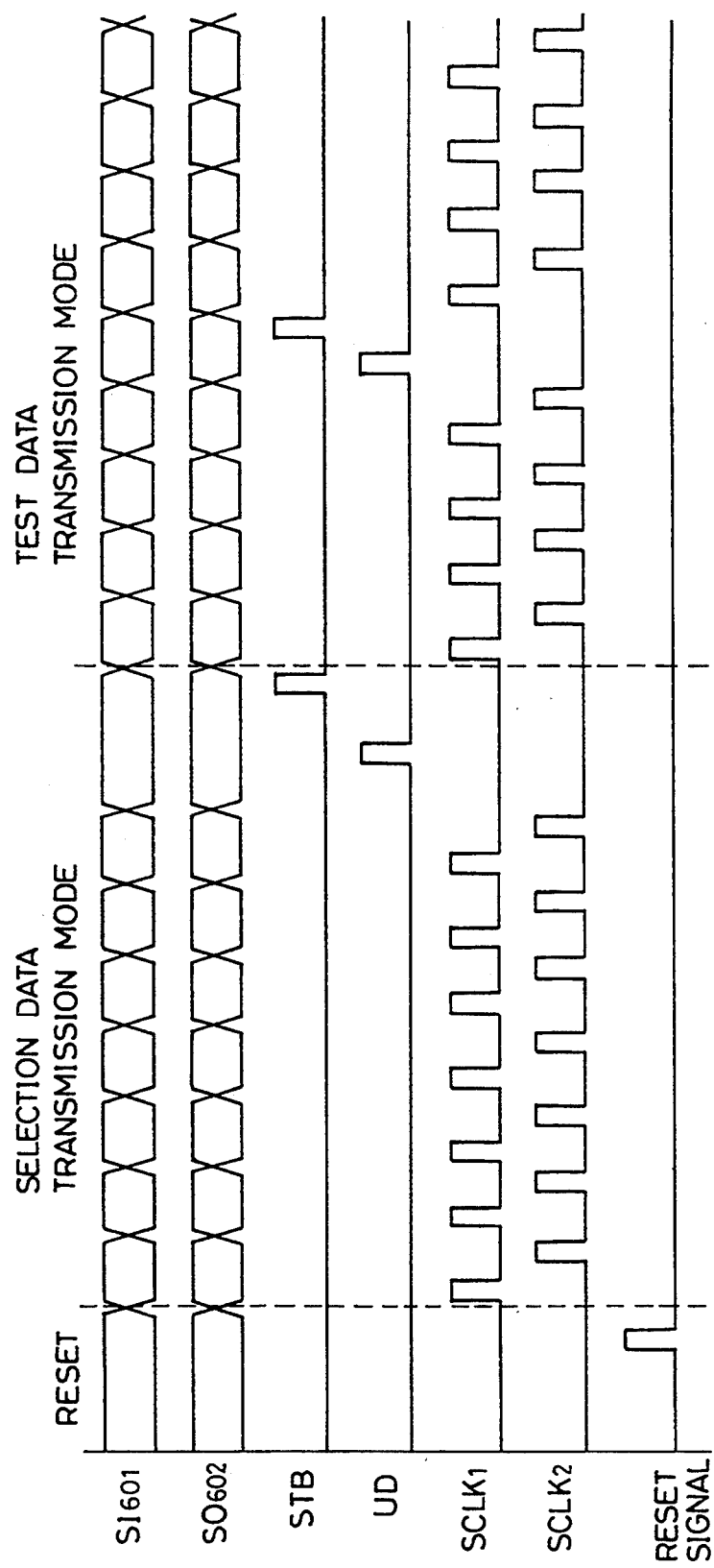
FIG. 10 is a timing chart for describing operation of the embodiment shown in FIG. 9.

Next, referring to the timing chart shown in FIG. 10, operation of the embodiment shown in FIG. 9 will be described.

(1) Operation in Normal Mode

A reset signal is fixed to a H level and a strobe signal STB and an update signal UD applied to each of SRLs 11-16 are fixed to a H level. Accordingly, in each SRL 11-16, a data through state is implemented between data input terminals DI1-DI6 and data output terminals DO1-DO6. As a result, system data is transmitted without any problem.

(2) Operation in Test Mode

<1> Reset

A reset signal is raised to a H level. Thus, selection data holding latch 25 and SR flipflop 27 are reset. Accordingly, an output signal of output terminal Q of selection data holding latch 25 attains a L level and multiplexer 21 selects an output of scan path 10. Also, an output signal of inversion output terminal/Q of selection data holding latch 25 attains a H level and AND gates 23a, 23b supply a strobe signal STB, an update signal UD, shift clock signals SCLK1 and SCLK2 to each of the SRLs 11-16. Accordingly, scan path 10 comes in a data transmittable state.

<2> Transmission of Selection Data a) Shift-In of Selection Data

Selection data is serially inputted from SI terminal 201 together with dummy data. At this time, shift clock signals SCLK1 and SCLK2 are provided as non-overlapping two-phase clock signals. Accordingly, SRLs 11-16 in the respective scan paths perform shift operation to shift selection data and dummy data. As a result, selection data is set in SRL 16 in each scan path and dummy data is set in other SRLs 11-15.

b) Capturing of Selection Data

An update signal UD is raised to a H level. At this time, as RS flipflop 27 is reset, an output signal of the output terminal Q is at an L level. Accordingly, an output signal of AND gate 28 attains a H level, and selection data holding circuit 25 captures and holds selection data set in SRL 16 accordingly. When selection data holding latch 25 holds selection data "0", multiplexer 21 selects an output signal of scan path 10. Also, AND gates 23a and 23b come in a state capable of supplying a group of control signals (a strobe signal STB, an update signal UD, shift clock signals SCLK1 and SCLK2) to each of SRLs 11-16. On the other hand, when selection data holding latch 25 holds selection data "1", multiplexer 21 selects an input signal from SI terminal 201 and a bypass path is selected as a data transmission path. At this time AND gates 23a and 23b do not supply a control signal group to each of SRLs 11-16.

Subsequently, a strobe signal STB is raised to a H level. Thus, RS flipflop 27 is set and an output signal of the output terminal Q attains a H level. Accordingly, AND gate 28 does not supply an update signal UD to selection data holding latch 25 until RS flipflop 27 is reset again. Thus, it is prevented that selection data holding latch 25 undesirably captures and holds data set in SRL 16 even if an update signal UD rises in a transmission mode of test data.

<3> Transmission of Test Data a) Shift-In of Test Data

Test data is serially inputted from SI terminal 201. Also, shift clock signals SCLK1 and SCLK2 are provided as non-overlapping two-phase clock signals. Accordingly, inputted test data is transmitted on scan path 10 or a bypass path to be set in a predetermined SRL.

b) Provision of Test Data

An update signal UD is raised to a H level and test data held in a given SRL is applied to an input terminal of BUT 40 through data output terminals DO1-DO6. BUT 40 provided with test data processes the test data according to its internal logic structure to output test result data from its output terminal. At this time, RS flipflop 27 is in a set state, an output signal of AND gate 28 is fixed to a L level. Accordingly, even if an update signal UD rises, selection data holding circuit 25 does not capture set data of SRL 16.

c) Capturing of Test Result Data

A strobe signal STB is raised to a H level. Thus, test result data outputted from an output terminal of BUT 40 is captured and held in a given SRL.

d) Shift-Out of Test Result Data

Shift clock signals SCLK1 and SCLK2 are provided as non-overlapping two-phase clock signals. As a result, test result data held in a given SRL is sequentially shifted to be outputted to SO terminal 204.

Figure 11:
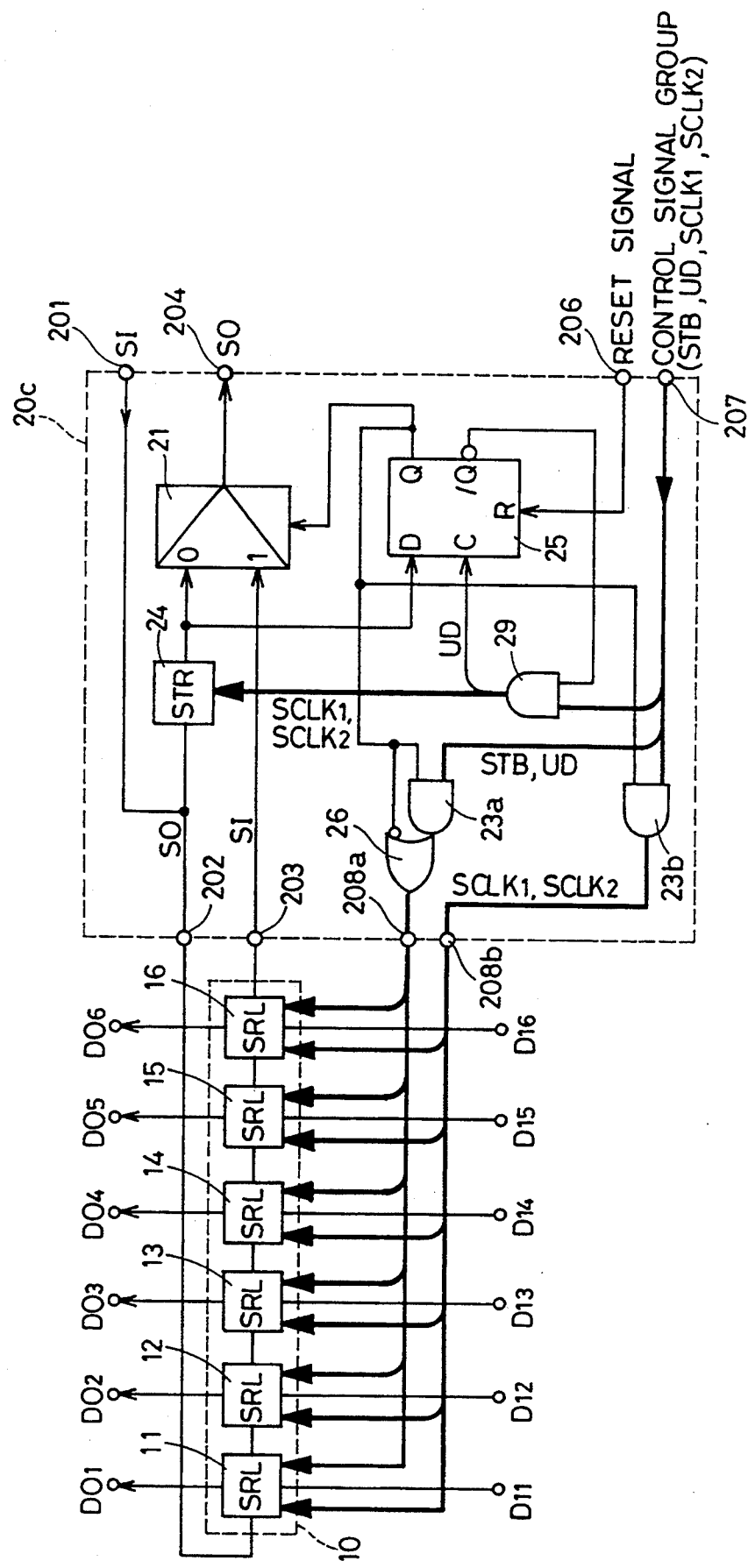
FIG. 11 is a block diagram illustrating structure of a bypass scan path of the third embodiment of the present invention.

FIG. 11 is a block diagram showing structure of a bypass scan path of the third embodiment of the present invention. In the figure, a STR 24 is connected between a connection point of a SI terminal 201 and a SO terminal 202 and an input terminal of a multiplexer 21. That is, STR 24 is provided on a bypass path. A strobe signal STB, an update signal UD are provided from an input terminal 207 to one input terminal of an AND gate 23a. Shift clock signals SCLK1 and SCLK2 are provided to one input terminal of an AND gate 23b from input terminal 207. An output signal of an output terminal Q of selection data holding latch 25 is provided to each of other input terminals of AND gates 23a and 23b. An output signal of AND gate 23a is applied to one input terminal of an OR gate 26. An output signal of output terminal Q of selection data holding latch 25 is inverted and then applied to the other input terminal of OR gate 26. AND gate 23a and OR gate 26 are individually provided for each of a strobe signal STB and an update signal UD. Similarly, AND gate 23b is individually provided for each of shift clock signals SCLK1 and SCLK2.

An output signal of OR gate 26 and an output signal of AND gate 23b are applied to SRLs 11-16. A scan path selecting circuit 20c further includes an AND gate 29. An update signal UD, shift clock signals SCLK1 and SCLK2 are provided to one input terminal of AND gate 29 from input terminal 207. An output signal of an inversion output terminal/Q of selection data holding latch 25 is applied to the other input of AND gate 29. AND gate 29 is individually provided for each of update signal UD, shift clock signals SCLK1 and SCLK2. Among output signals of AND gate 29, an update signal UD is applied to a clock signal input terminal C of selection data holding latch 25 and shift clock signals SCLK1 and SCLK2 are applied to STR 24. A data input terminal D of selection data holding latch 25 is connected to an output terminal of STR 24. Accordingly, selection data holding latch 25 captures and holds selection data set in STR 24. Multiplexer 21 in FIG. 11, on the contrary to the multiplexer shown in FIG. 1 or FIG. 9, selects an output signal of scan path 10 when a selection control signal applied from output terminal Q of selection data holding latch 25 is at a H level, and selects an output signal of STR 24 when it is at a L level.

Other structure of the embodiment shown in FIG. 11 is the same as the embodiment shown in FIG. 1, so the same reference numbers are assigned to corresponding portions and a description thereof is not repeated.

Next, operation of the embodiment shown in FIG. 11 will be described.

(1) Operation in Normal Mode

A reset signal is raised to a H level and selection data holding register 25 is reset. Thus, an output signal of output terminal Q of selection data holding register 25 attains a L level and OR gate 26 fixes strobe signal STB and update signal UD applied to each of SRLs 11–16 to a H level. Accordingly, in each of SRLs 11–16, a data through state is implemented between data input terminals DI1–DI6 and data output terminals DO1–DO6 and system data is transmitted without any problem.

(2) Operation in Test Mode

<1> Reset

A reset signal is raised to a H level and selection data holding register 25 is reset. Thus, an output signal of output terminal Q of selection data holding register 25 attains a L level, and multiplexer 21 selects an output signal of STR 24. That is, a bypass path is selected as a data transmission path. Also, AND gates 23a and 23b do not supply a control signal group to SRLs 11–16 in response to that an output signal of output terminal Q of selection data holding register 25 is at a L level. Accordingly, scan path 10 comes in a data untransmittable state. On the other hand, AND gate 29 supplies shift clock signals SCLK1 and SCLK2 to STR 24 in response to that an output signal of inversion output terminal/Q of selection data holding register 25 is at a H level, and supplies an update signal UD to clock signal input terminal C of selection data holding register 25.

<2> Transmission of Selection Data a) Shift-In of Selection Data

Selection data is serially inputted from SI terminal 201. At this time, shift clock signals SCLK1 and SCLK2 are provided as non-overlapping two-phase clock signals. Accordingly, inputted selection data is shifted by STR 24 provided on the bypass path to be outputted to SO terminal 204. Given selection data is set in STR 24 and then input of selection data and shift operation of STR 24 are stopped.

b) Capturing of Selection Data

An update signal UD is raised to a H level. Thus, selection data holding latch 25 captures and holds selection data set in STR 24. If selection data holding latch 25 holds selection data "0", multiplexer 21 selects a bypass path as a data transmission path, that is, it selects an output signal of STR 24. At this time, AND gates 23a and 23b do not supply a control signal group to SRLs 11–16. On the other hand, AND gate 29 supplies shift clock signals SCLK1 and SCLK2 to STR 24 and supplies an update signal UD to clock signal input terminal C of selection data holding latch 25. On the other hand, selection data holding latch 25 holds selection data "1", multiplexer 21 selects an output of scan path 10. At this time, AND gates 23a and 23b supply a group of control signals to SRLs 11–16. Accordingly, scan path 10 comes in a data transmittable state. On the other hand, AND gate 29 does not supply shift clock signals SCLK1 and SCLK2 to STR 24 and does not supply an update signal UD to selection data holding latch 25. Accordingly, STR 24 comes in a data untransmittable state.

<3> Transmission of Test Data a) Shift-In of Test Data

Test data and selection data for re-setting are serially inputted from SI terminal 201. At this time, shift clock signals SCLK1 and SCLK2 are provided as non-overlapping two-phase clock signals. Accordingly, when selection data holding latch 25 holds selection data "1", inputted test data and selection data are sequentially shifted by SRLs 11–16 to be outputted to SO terminal 204. On the other hand, when selection data holding latch 25 holds selection data "0", inputted test data and selection data are shifted by STR 24 to be outputted to SO terminal 204. When input of test data and selection data is finished, given test data is set in STRs 11–16. On the other hand, when multiplexer 21 selects a bypass path, test data is not set in SRLs 11–16 and selection data "0" is set again in STR 24.

b) Provision of Test Data

An update signal UD is raised to a H level. When selection data holding register 25 holds selection data "1", the update signal UD is supplied to SRLs 11–16 through AND gates 23a and 23b. Accordingly, SRLs 11–16 output set test data to data output terminals DO1–DO6, respectively. The outputted test data is applied to corresponding BUT 40. At this time, AND gate 29 does not supply an update signal UD to selection data holding register 25, so that selection data holding register 25 does not capture selection data from STR 24. On the other hand, when selection data "0" is held in selection data holding register 25, AND gates 23a and 23b do not supply a control signal group to SRLs 11–16. Accordingly, SRLs 11–16 do not provide test data to corresponding BUT 40. At this time, AND gate 29 supplies an update signal UD to selection data holding register 25. Accordingly, selection data holding register 25 captures and holds selection data set in STR 24. At this time, as selection data "0" is set again in STR 24, contents of held data of selection data holding register 25 do not change.

c) Capturing of Test Result Data

A strobe signal STB is raised to a H level. At this time, if selection data holding register 25 holds selection data "1", a strobe signal STB is supplied to SRLs 11–16. Accordingly, SRLs 11–16 capture and hold test result data outputted from corresponding BUT to data input terminals DI1–DI6.

d) Shift-Out of Test Result Data

Shift clock signals SCLK1 and SCLK2 are provided as non-overlapping two-phase clock signals. At this time, if selection data holding latch 25 holds selection data "1", SRLs 11–16 sequentially shift the test result data to output the data to SO terminal 204. On the other hand, if selection data holding latch 25 holds selection data "0", STR 24 shifts test result data from another test module inputted from SI terminal 201, which is outputted to SO terminal 204.

Figure 12:
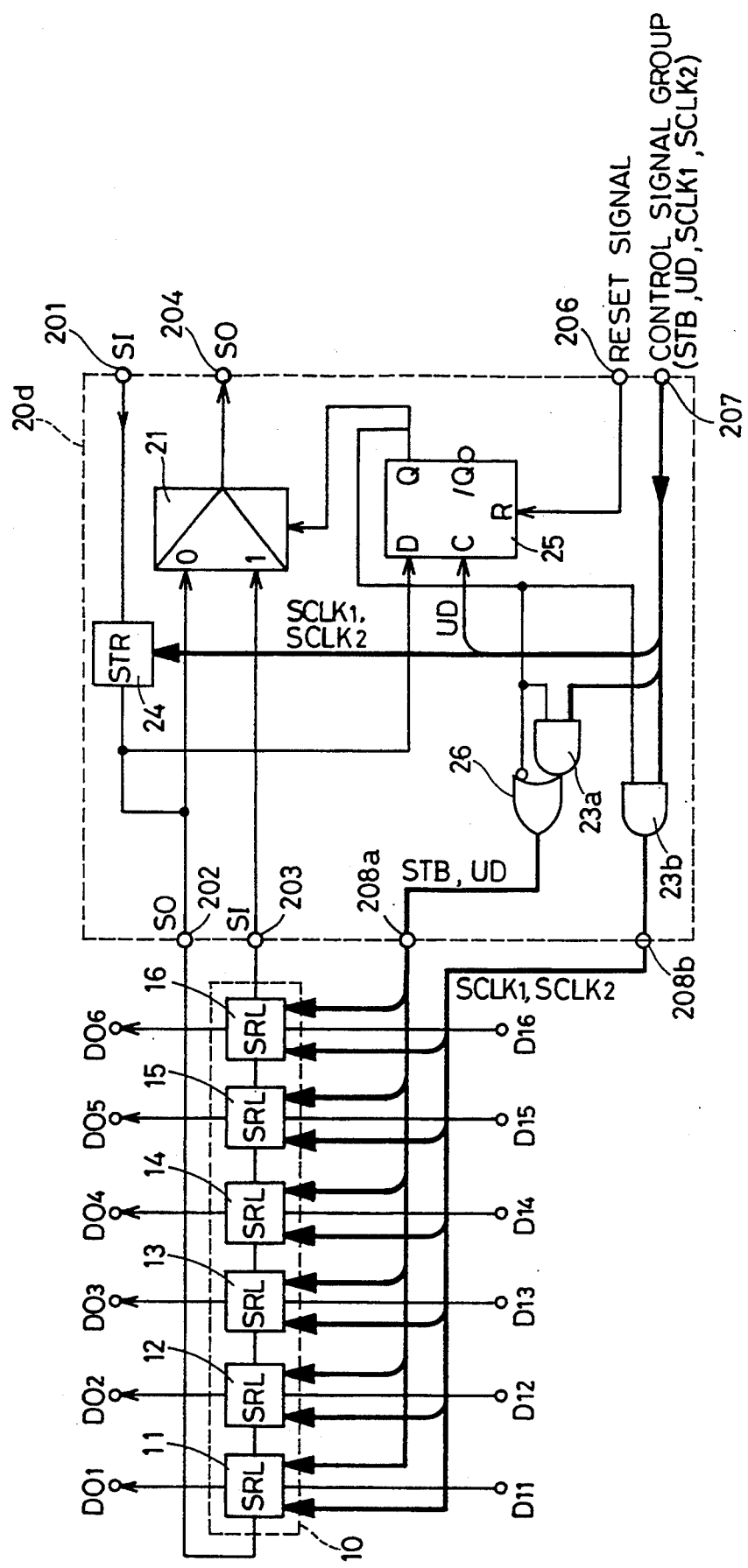
FIG. 12 is a block diagram illustrating structure of a bypass scan path of the fourth embodiment of the present invention.

FIG. 12 is a block diagram showing structure of a bypass scan path of the fourth embodiment of the present invention. In the figure, STR 24 is interposed between a connecting point of SO terminal 202 and the other input terminal of multiplexer 21 and SI terminal 201. Shift clock signals SCLK1 and SCLK2 are directly supplied to STR 24 from input terminal 207. An update signal UD is directly supplied from input terminal 207 to clock signal input terminal C of selection data holding latch 25. Therefore, in scan path selecting circuit 20d, an AND gate 29 as shown in FIG. 11 is omitted.

Next, operation of the embodiment shown in FIG. 12 will be described. The operation of the embodiment shown in FIG. 12 is substantially the same as the operation of the embodiment shown in FIG. 11, so that different operation only will be described in detail.

(1) Operation in Normal Mode

It is the same as the operation of the embodiment shown in FIG. 11.

(2) Operation in Test Mode

<1> Reset

Similarly to the embodiment shown in FIG. 11, multiplexer 21 selects a bypass path, i.e., an output signal of STR 24.

<2> Transmission of Selection Data a) Shift-In of Selection Data

In STR 24, selection data inputted from SI terminal is set.

b) Capturing of Selection Data

An update signal UD is raised to a H level, and selection data holding latch 25 captures and holds selection data set in STR 24.

<3> Transmission of Test Data a) Shift-In of Test Data

When selection data "1" is held in selection data holding register 25, test data and selection data inputted from SI terminal 201 are shifted by STR 24 and SRLs 11-16 and outputted to SO terminal 204. When input of test data is finished, selection data "1" is set in STR 24 and test data is set in SRLs 11-16. On the other hand, when selection data "0" is set in selection data holding latch 25, test data and selection data inputted from DI terminal 201 are shifted by STR 24 and outputted to SI terminal 204. Input of test data and selection data is finished, selection data "0" is then set in STR 24.

b) Provision of Test Data

An update signal UD is raised to a H level. When selection data "1" is held in selection data holding latch 25, an update signal UD is supplied to SRLs 11-16. Accordingly, SRLs 11-16 output held test data to data output terminals DO1-DO6. The outputted test data is applied to corresponding BUT 40. At this time, since selection data "1" is set in STR 24, even if an update signal UD rises to a H level, the held data in selection data holding register 25 is not changed. On the other hand, when selection data "0" is held in selection data holding latch 25, an update signal UD is not supplied to SRLs 11-16. Accordingly, SRLs 11-16 do not provide test data to corresponding BUT 40. At this time, selection data "0" is set in STR 24. Accordingly, even if an update signal UD rises to a H level, held data in selection data holding latch 25 is not changed.

c) Capturing of Test Result Data

A strobe signal STB is raised to a H level. When selection data "1" is held in selection data holding latch 25, a strobe signal STB is supplied to SRLs 11-16. Accordingly, SRLs 11-16 capture and hold test result data outputted from corresponding BUT 40 from data input terminals DI1-DI6. On the other hand, when selection data "0" is held in selection data holding latch 25, a strobe signal STB is not supplied to SRLs 11-16. Accordingly, SRLs 11-16 do not capture the test result data.

d) Shift-Out of Test Result Data

When selection data "1" is held in selection data holding latch 25, test result data held in SRLs 11-16 is sequentially shifted to be outputted to SO terminal 204. On the other hand, when selection data "0" is held in selection data holding latch 25, test result data from another test module inputted from SI terminal 201 is shifted by STR 24 to be outputted to SO terminal 204.

Each of the bypass scan paths shown in FIGS. 1, 9, 11 and 12 do not use a mode latch signal for controlling scan path selecting circuits 20a-20d and uses a group of control signals for SRL in substitution for a mode latch signal, so that the number of input terminals and the number of signal interconnections are smaller than those of a conventional bypass scan path. Also, since an integrated circuit device formed using such a bypass scan path as described above does not require externally introducing mode latch signals, it can be adapted to the standard of the boundary scan test of the IEEE 1149.1.

The present invention is not limited to the embodiments described above, wherein various modifications are possible. Some of such modifications of the present invention will be described below.

(1) In the embodiments described above, a bypass scan path is provided individually for each functional module, which is made to execute testing only of a corresponding functional module, respectively. However, each bypass scan path may not be provided individually for each functional module, and it is sufficient if it is made to execute testing of an arbitrary functional module, respectively. For example, a certain bypass scan path may be made to apply test data to a certain functional module and capture test result data from another functional module. Also, a certain bypass scan path may be made to apply test data to a plurality of functional modules and capture test result data from a plurality of functional modules.

(2) Each bypass scan path may be used for a purpose of checking disconnection of signal lines interposed between a control point and an observation point not only of testing a logical circuit inside an integrated circuit device.

(3) Each bypass scan path is used for testing a functional module, but it may be used for other purposes. For example, each bypass scan path may be used for a purpose of transmitting data other than test data (system data, for example) to apply the data to a control point in an integrated circuit device, and capturing, shifting and outputting to outside some data from an observation point.

(4) A plurality of integrated circuit devices may be provided on a single board, one or a plurality of bypass scan path or bypass scan paths may be provided in each integrated circuit device, the bypass scan paths may be connected in series among respective integrated circuit devices, and testing of a plurality of integrated circuit devices may be simultaneously performed. Accordingly, the case is a possibility in which only one bypass scan path is provided on a single chip.

In summary, a bypass scan path of the present invention essentially has a structure in which some data serially inputted from outside (control point data) is transmitted by a scan path to be applied to a control point in an integrated circuit device, and observation point data is captured from an observation point and shifted to be externally and serially outputted. Accordingly, the purposes, structure and the number of bypass scan paths are not limited to the above described embodiments.

As described above, according to the present invention, a scan path selecting means is made to be controllable only with a reset signal and a control signal group for a first shift register means, so that a mode latch signal does not have to be externally introduced, with the result that the number of input terminals and signal lines are reduced. Also, a bypass scan path of the present invention is controlled only with signals which can be generated by a test controller defined in the standard of the IEEE 1149.1, so that an integrated circuit device configured using a bypass scan path of the present invention can be completely adapted to the standard of the IEEE 1149.1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bypass scan path used in an integrated circuit device having at least one control point and at least one observation point inside for transmitting and providing control point data inputted from outside to the control point and transmitting and outputting observation point data obtained from the observation point to the outside, comprising:
   a single data input terminal for serially inputting selection data for selecting a transmission path of data and said control point data, respectively;
   a single data output terminal for serially outputting said observation point data;
   first shift register means including at least one shift register latch connected in series each being coupled to said control point and/or said observation point, and interposed between said data input terminal and said data output terminal for shifting and holding said control point data and said observation point data; and
   scan path selecting means for selecting either one of a shift path passing through said first shift register means and a bypass path bypassing said first shift register means as a data transmitting path between said data input terminal and said data output terminal on the basis of said selection data inputted from said data input terminal,
   wherein said scan path selecting means is controlled only by a reset signal and a group of control signals also used by said first shift register means.

2. The bypass scan path according to claim 1, wherein said scan path selecting means comprises,
   selection data holding means for capturing and holding said selection data inputted from said data input terminal, and
   selector means for connecting either one of said shift path and said bypass path to said data output terminal on the basis of the selection data held by said selection data holding means, and
   said selection data holding means is reset in response to said reset signal, and timing of capturing said selection data is controlled in response to a specific signal in said control signal group.

3. The bypass scan path according to claim 2, wherein said control signal group includes an update signal for determining timing of outputting said control point data held by said first shift register means to said control point,
   a first taming pulse for determining capturing timing of said selection data is added to said update signal, and
   said selection data capturing timing is controlled in response to said first timing pulse in said update signal in said selection data holding means.

4. The bypass scan path according to claim 3, wherein
   said selector means selects said shift path in response to that said selection data holding means being reset by said reset signal, and
   said selection data is input from said data input terminal after reset of said selection data selecting means.

5. The bypass scan path according to claim 4, wherein
   said scan path selecting means further comprises second shift register means interposed between said first shift register means and said selector means, and
   said selection data holding means captures and holds the selection data held by said second shift register means.

6. The bypass scan path according to claim 5, wherein
   said control signal group further comprises a strobe signal for determining timing at which said first shift register means captures said observation point data from said observation point, and a shift clock signal for controlling shift operation of said first shift register means, and
   said scan path selecting means further comprises gate means responsive to that said selection data holding means holding selection data, for selecting said shift path for applying said update signal, said strobe signal, said shift clock signal to said first shift register means, and also applying said shift clock signal to said second shift register means.

7. The bypass scan path according to claim 6, wherein
   said scan path selecting means further comprises means, responsive to said reset signal in an active level state, for fixing said update signal and said strobe signal applied to said first shift register means to an active level, and
   wherein said means for fixing implements a data through state between a terminal for capturing said observation point data and a terminal for outputting said control point data in said first shift register means.

8. The bypass scan path according to claim 4, wherein said selection data holding means captures and holds selection data held at any bit of said first shift register means.

9. The bypass scan path according to claim 8, wherein
   said control signal group further comprises a strobe signal for determining timing at which said first shift register means captures said observation point data from said observation point and a shift clock signal for controlling shift operation of said first shift register means, and
   said scan path selecting means further comprises gate means responsive to said selection data holding means holding selection data, for selecting said shift path for providing said update signal, said strobe signal, said shift clock signal to said first shift register means.

10. The bypass scan path according to claim 9, wherein
    second taming pulse generated immediately after generation of said first timing pulse in said update signal is added to said strobe signal, and
    said scan path selecting means further comprises means responsive to said second timing pulse in said strobe signal for making said update signal applied thereafter to said selection data holding means invalid.

11. The bypass scan path according to claim 10, wherein said scan path selecting means further comprises means, responsive to said reset signal in an active level state, for fixing said update signal and said strobe signal applied to said first shift register means to an active level, and
wherein said means for fixing implements a data through state between a terminal for capturing said observation point data and a terminal for outputting said control point data in said first shift register means.

12. The bypass scan path according to claim 3, wherein
said selector means selects said bypass path in response to said selection data holding means being reset by said reset signal, and
said selection data is input from said data input terminal after reset of said selection data holding means.

13. The bypass scan path according to claim 12, wherein
said scan path selecting means further comprises third shift register means interposed on said bypass path, and
said selection data holding means captures and holds selection data held by said third shift register means.

14. The bypass scan path according to claim 13, wherein said control signal group further includes a strobe signal for determining timing at which said first shift register means captures said observation point data from said observation point, and a shift clock signal for controlling shift operation of said first shift register means, and
said scan path selecting means further comprises,
first gate means responsive to said selection data holding means holding the selection data for selecting said shift path and for providing said update signal, said strobe signal, said shift clock signal to said first shift register means, and
second gate means responsive to said selection data holding means holding the selection data for selecting said bypass path and for providing said shift clock signal to said third shift register means.

15. The bypass scan path according to claim 14, wherein said second gate means is unaffected by said update signal applied to said selection data holding means when said selection data holding means holds the selection data for selecting said shift path.

16. The bypass scan path according to claim 15, wherein said scan path selecting means further comprises means, responsive to said selection data holding means holding selection data, for selecting said bypass path for fixing said update signal and said strobe signal provided to said first shift register means to an active level, and
wherein said means for fixing implements a data through condition between a terminal for capturing said observation point data and a terminal for outputting said control point data in said first shift register means.

17. The bypass scan path according to claim 3, wherein
said scan path selecting means further comprises fourth shift register means interposed between said data input terminal and a connecting point of said shift path and said bypass path, and
said selection data holding means captures and holds selection data held by said fourth shift register means.

18. The bypass scan path according to claim 17, wherein said control signal group further comprises a strobe signal for determining timing at which said first shift register means captures said observation point data from said observation point and a shift clock signal for controlling shift operation of said first shift register means, and
said scan path selecting means further comprises
gate means, responsive to said selection data holding means holding selection data for selecting said shift path for applying said update signal, said strobe signal and said shift clock signal to said first shift register means, and
means for applying said shift clock signal to said fourth shift register means.

19. The bypass scan path according to claim 18, wherein said scan path selecting means further comprises means, responsive to said selection data holding means holding selection data, for selecting said bypass path for fixing to an active level said update signal and said strobe signal applied to said first shift register means, and
wherein said means for fixing implements a data through state between a terminal for outputting said control point data in said first shift register means.

20. The bypass scan path according to claim 1, wherein a dedicated signal line is not needed to control said scan path selecting means.

21. An integrated circuit device in which a plurality of control points and a plurality of observation points exist, comprising
a single external data input terminal for serially inputting selection data for selecting a data transmission path and control point data to be applied to said control point, respectively;
a single external data output terminal for outputting serially observation data obtained from said observation point; and
at least one bypass scan path connected in series between said external data input terminal and said external data output terminal for forming a serial transmission path with respect to said selection data, said control point data and said observation point data;
wherein each said bypass scan path comprises
a single internal data input terminal for serially inputting said selection data and said control point data respectively,
a single internal data output terminal for serially outputting said observation point data,
first shift register means including at least one shift register latch connected in series, each being connected to said control point and/or said observation point, and interposed between said internal data input terminal and said internal data output terminal for shifting and holding said control point data and said observation point data, and
scan path selecting means for selecting either one of a shift path passing through said first shift register means and a bypass path bypassing said first shift register means as a data transmission path between said internal data input terminal and said internal data output terminal on the basis of said selection data inputted from said internal data input terminal, and said scan path selecting means is controlled only by a reset signal and a control signal group also used by said first shift register means, and each said bypass scan path applies said control point data to said control point after shifting by said first shift register means when said shift path is selected by said scan path selecting means, and/or shifts and outputs from said internal data output terminal observation point data obtained from said observation point after capturing into said first shift register means.

22. The integrated circuit device according to claim 21, further comprising:
    a plurality of functional modules each including a predetermined logic circuit, and
    said control point and said observation point being provided related to each said functional module.

23. The integrated circuit device according to claim 22, wherein each said bypass scan path is individually provided for each said functional module.

24. The integrated circuit device according to claim 23, wherein said scan path selecting means in each said bypass scan path selects said shift path for a functional module objective of testing and selects said bypass path for a functional module not objective of testing.

25. The integrated circuit device according to claim 24, further comprising input terminal group for inputting said reset signal and said control signal group from outside.

26. The integrated circuit device according to claim 24, further comprising a .test controller for generating said reset signal and said control signal group.

27. The integrated circuit device according to claim 26, wherein said test controller meets with a boundary scan test defined in the IEEE 1149.1.

28. The integrated circuit device according to claim 22, wherein
    said control point data is test data for said functional modules, and
    said observation point data is test result date of said functional modules.

29. An integrated circuit device for providing access to internal conditions of internal circuitry and for analyzing the internal conditions, comprising:
    shift register latches connected in series and having one of a control point and an observation point providing access to the internal conditions, said shift register latches shifting and holding control and observation point data responsive to reset and control signals; and
    scan path selecting means for selecting one of a shift path passing through said shift register latches and a bypass path bypassing said shift register latches, said scan path selecting means selecting the one of the shift and bypass paths responsive to the reset signal and the control signal which are also used to control said shift register latches.

30. An integrated circuit device according to claim 29,
    wherein the reset signal is used to either set said shift register latches to a normal operation mode or to set said scan path selecting means to a selection data operation mode, and
    wherein the reset signal is not activated in transmissive and test states.

31. An integrated circuit according to claim 29,
    wherein a dedicated signal line is not needed to control said scan path selecting means.

* * * * *